（12） United States Patent
Lu et al.

(10) Patent No.: US 10,326,411 B2
(45) Date of Patent: Jun. 18, 2019

(54) OPERATIONAL AMPLIFIER CIRCUIT CAPABLE OF IMPROVING LINEARITY RELATION BETWEEN LOADING CURRENT AND INPUT VOLTAGE DIFFERENCE

(71) Applicant: NOVATEK MICROELECTRONICS CORP., HsinChu (TW)

(72) Inventors: Chih-Wen Lu, Hsinchu (TW);
Chih-Hsien Chou, Hsinchu (TW);
Po-Yu Tseng, Taoyuan (TW);
Jhih-Siou Cheng, New Taipei (TW)

(73) Assignee: NOVATEK MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/802,617

(22) Filed: Nov. 3, 2017

(65) Prior Publication Data

US 2018/0337642 A1    Nov. 22, 2018

Related U.S. Application Data

(63) Continuation-in-part of application No. 15/716,789, filed on Sep. 27, 2017.
(Continued)

(51) Int. Cl.
*H03F 3/45* (2006.01)
*H03F 1/32* (2006.01)
(Continued)

(52) U.S. Cl.
CPC ........... *H03F 1/3205* (2013.01); *H03F 1/086* (2013.01); *H03F 1/301* (2013.01); *H03F 1/3211* (2013.01);
(Continued)

(58) Field of Classification Search
CPC ...... H03F 1/3205; H03F 3/4521; H03F 1/301; H03F 1/086; H03F 3/45381;
(Continued)

(56) References Cited

U.S. PATENT DOCUMENTS 6,215,339 B1 * 4/2001 Hedberg ............ H03K 19/0016
327/108
7,078,969 B2 * 7/2006 Bhattacharjee .......... G06G 7/30
327/357
(Continued)

OTHER PUBLICATIONS

Non-Final Office Action issued in U.S. Appl. No. 15/716,789, filed Sep. 27, 2017, dated Jun. 1, 2018.
(Continued)

*Primary Examiner* — Khanh V Nguyen
(74) *Attorney, Agent, or Firm* — McClure, Qualey & Rodack, LLP

(57) ABSTRACT

An operational amplifier circuit is provided. The operational amplifier circuit includes a differential input stage circuit and a loading stage circuit. The differential input stage circuit includes an input circuit, a voltage maintaining circuit, and a current source. The input circuit includes a first input transistor and a second input transistor, for receiving a first and a second input signals, respectively. The voltage maintaining circuit includes a first branch circuit and a second branch circuit. The first branch circuit is coupled to the first input transistor for receiving the first input signal, and the second branch circuit is coupled to the second input transistor for receiving the second input signal. The current source is coupled to the first input transistor and the second input transistor. The loading stage circuit is coupled to the voltage maintaining circuit.

13 Claims, 17 Drawing Sheets

Related U.S. Application Data

(60) Provisional application No. 62/508,457, filed on May 19, 2017.

(51) Int. Cl.
  *H03F 1/52* (2006.01)
  *H03K 17/06* (2006.01)
  *H03F 1/08* (2006.01)
  *H03F 1/30* (2006.01)
  *H03K 17/082* (2006.01)

(52) U.S. Cl.
  CPC ............ *H03F 1/523* (2013.01); *H03F 3/4521* (2013.01); *H03F 3/45183* (2013.01); *H03F 3/45219* (2013.01); *H03F 3/45237* (2013.01); *H03F 3/45381* (2013.01); *H03F 3/45632* (2013.01); *H03K 17/063* (2013.01); *H03K 17/0822* (2013.01); *H03F 2203/45342* (2013.01); *H03F 2203/45352* (2013.01); *H03F 2203/45382* (2013.01); *H03F 2203/45384* (2013.01)

(58) Field of Classification Search
  CPC ........ H03F 3/45632; H03F 1/523; H03F 3/45; H03F 3/45179; H03F 3/45183; H03F 3/45188; H03F 3/45192; H03F 2200/177; H03K 17/0822; H03K 17/063
  USPC ........................................................ 330/253
  See application file for complete search history.

(56) References Cited

U.S. PATENT DOCUMENTS

| | | | |
|---|---|---|---|
| 8,384,465 B2 * | 2/2013 | Zanchi | ................. H03F 1/3211 327/116 |
| 2003/0095003 A1 | 5/2003 | Li et al. | |
| 2007/0247227 A1 | 10/2007 | Zhang | |
| 2008/0106335 A1 | 5/2008 | Kimura | |
| 2008/0309408 A1 | 12/2008 | Lih | |

OTHER PUBLICATIONS

TIPO Office Action dated Oct. 16, 2018 in Taiwan application (No. 107108231).

* cited by examiner

OPERATIONAL AMPLIFIER CIRCUIT CAPABLE OF IMPROVING LINEARITY RELATION BETWEEN LOADING CURRENT AND INPUT VOLTAGE DIFFERENCE

This application is a continuation-in-part application of co-pending application Ser. No. 15/716,789, filed on Sep. 27, 2017, which claims the benefit of U.S. provisional application Ser. No. 62/508,457, filed on May 19, 2017, the contents of which are incorporated herein by reference.

TECHNICAL FIELD

The disclosure relates in general to an operational amplifier circuit, and more particularly to an operational amplifier circuit capable of improving linearity relation between the loading current and the input voltage difference of the differential input stage circuit.

BACKGROUND

An operational amplifier circuit has a variety of applications in modern electronic devices. For example, the operational amplifier circuit may be used in a driver circuit for driving a display panel, such as a liquid crystal display (LCD) panel. It is common for an operational amplifier to adopt a differential pair as an input stage for receiving input signals. The linear range of the differential pair is affected by the input voltage difference of the differential pair. For example, the relation between the input voltage difference and the loading current (such as the drain current in a MOSFET implemented differential pair) is linear when the input voltage difference is small. However, the relation becomes nonlinear when the input voltage difference is too large. In order to increase the linear range, a known approach is to provide larger bias current for the differential pair, which in turn results in larger power consumption.

FIG. 1 shows a block diagram of an example operational amplifier. The operational amplifier (OP) circuit 10 includes a differential input stage circuit 111, a loading stage circuit 112, and an output stage circuit 131. The differential input stage circuit 111 receives a pair of differential signals including the first input signal $V_{in1}$ and the second input signal $V_{in2}$. The differential input stage circuit 111 may be configured to convert a voltage difference between the first input signal $V_{in1}$ and the second input signal $V_{in2}$ to loading currents $i_1$, $i_2$. The loading stage circuit 112 may be configured to convert the loading currents $i_1$, $i_2$ outputted by the differential input stage circuit 111 to an output signal $V_O$. The loading stage circuit 112 may include an active load circuit (such as transistors) and/or a passive load circuit (such as resistors, capacitors, and inductors). The loading stage circuit 112 may also be referred as a gain stage circuit.

The combination of the differential input stage circuit 111 and the loading stage circuit 112 may be referred as the 1$^{st}$ stage OP 11, whose output is defined as a first stage output $V_{O1}$. The output stage circuit 131 may be referred as the 2$^{nd}$ stage OP 13, whose output is defined as a second stage output $V_{O2}$. The voltage gain $A_v$ of the operational amplifier circuit 10 is the product of the voltage gain $A_{v1}$ of the 1$^{st}$ stage OP 11 and the voltage gain $A_{v2}$ of the 2$^{nd}$ stage OP 12 ($A_v = A_{v1} \times A_{v2}$). The voltage gain $A_{v1}$ of the 1$^{st}$ stage OP 11 is the transconductance Gm of the differential input stage circuit 111 multiplied by the output resistance $r_o$ of the loading stage circuit 102 ($A_{v1} = Gm \times r_o$).

The second stage output $V_{O2}$ provided by the output stage circuit 131 is a single-ended voltage signal. If the operational amplifier circuit 10 is used in a display device, the output stage circuit 131 may be coupled to a display panel. It should be noted that number of Ops being included in the operational amplifier circuit 10 is not limited, and output of the last stage of the Ops in the operational amplifier circuit 10 is utilized as an output signal Vout. In the example shown in FIG. 1, the operational amplifier circuit 10 includes two stages of OP. In other embodiments, there may be only one stage OP or more than two stages of OP. Because the 2$^{nd}$ stage OP (as well as other 3$^{rd}$, 4$^{th}$ ... stage OP) is optional, the main focus in the following description will be on the 1$^{st}$ stage OP 11, including the differential input stage circuit 111 and the loading stage circuit 112.

FIG. 2A shows a circuit diagram of an example differential input stage circuit. In this example, the differential input stage circuit 111 of the operational amplifier circuit 10 includes two n-type metal-oxide-semiconductor field-effect transistor (NMOS) transistors M01 and M02 and a current source Iss. The current source Iss is coupled to a ground terminal Gnd. The two NMOS transistor Min1 and Min2 have equal gate width and equal gate length. The current value provided by the current source Iss is I. Transistor Min1 receives the first input signal $V_{in1}$, and transistor Min2 receives the second input signal $V_{in2}$. Being defined as input transistors, transistors Min1 and Min2 in the differential input stage circuit 111 operate in the saturation region.

In order to discuss the operation of the input transistors Min1 and Min2, two types of linearity enhancement circuit are provided in the present disclosure, namely, a bias control circuit and a voltage maintaining circuit. Basically, the bias control circuit is used to reduce the variance range of the loading current being affected by variance of the coupled in between the current source and an input circuit, and the voltage maintaining circuit is coupled in between the loading stage circuit and the input circuit.

The loading currents $i_1$ and $i_2$ flowing through these two input transistors Min1 and Min2 may be represented by the following formulas:

$$i_1 = \frac{I}{2} + \sqrt{\mu_n C_{ox} \frac{W}{L} Iss} \left(\frac{\Delta v_{in}}{2}\right) \sqrt{1 - \frac{(\Delta v_{in}/2)^2}{I/\mu_n C_{ox} \frac{W}{L}}} \quad \text{(Eq. 1A)}$$

$$i_2 = \frac{I}{2} - \sqrt{\mu_n C_{ox} \frac{W}{L} Iss} \left(\frac{\Delta v_{in}}{2}\right) \sqrt{1 - \frac{(\Delta v_{in}/2)^2}{I/\mu_n C_{ox} \frac{W}{L}}} \quad \text{(Eq. 1B)}$$

where $\mu_n$ is the charge-carrier effective mobility, W is the gate width of the NMOS transistor Min1, L is the gate length of the NMOS transistor Min1, $C_{ox}$ is the gate oxide capacitance per unit area, and $\Delta v_{in}$ is the input voltage difference, $\Delta v_{in} = V_{in1} - V_{in2}$. Based on Eq. 1A and Eq. 1B, when $$\frac{v_{id}}{2} \ll \sqrt{\frac{1}{\mu_n C_{ox} \frac{W}{L}}}, \quad \text{(Eq. 2)}$$

the loading currents $i_1$ and $i_2$ may be approximately represented as a linear relation as follows:

$$i_1 = \frac{I}{2} + \sqrt{\mu_n C_{ox} \frac{W}{L} Iss} \left(\frac{\Delta v_{in}}{2}\right) \quad \text{(Eq. 3A)}$$

$$i_2 = \frac{I}{2} - \sqrt{\mu_n C_{ox} \frac{W}{L} I_{SS}} \left(\frac{\Delta v_{in}}{2}\right) \quad \text{(Eq. 3B)}$$

That is, when the condition in Eq. 2 is satisfied, the relation between the loading currents $i_1$, $i_2$ and the input voltage difference $\Delta V_{in}$ is linear. The transconductance Gm of the differential pair shown in FIG. 2A is:

$$G_m = \frac{i_1}{\Delta v_{in}/2} = \sqrt{\mu_n C_{ox} \frac{W}{L} I_{SS}} \quad \text{(Eq. 4)}$$

Although the above analyses are based on the operation of the differential input pair having NMOS transistors, analyses for the differential input pair having PMOS transistors are similar and not redundantly illustrated.

FIG. 2B shows a diagram illustrating a transconductance of the differential input stage circuit shown in FIG. 2A. The horizontal axis is the input voltage difference $\Delta V_{in}$. The transconductance Gm is relatively stable when the input voltage difference $\Delta V_{in}$ is small, and hence there is a linear transfer relation between the loading currents $i_1$, $i_2$ and the input voltage difference $\Delta V_{in}$. When the input voltage difference $\Delta V_{in}$ becomes larger, the transconductance Gm decreases, and the transfer relation becomes nonlinear. When the input voltage difference $\Delta V_{in}$, exceeds $+\Delta V1$ (or less than $-\Delta V1$), the transconductance Gm becomes 0, and hence the differential pair does not worker properly under such input voltage condition.

Normally, the input transistors Min1, Min2 are desired to operate in the saturation region. For transistors operate in the saturation region, whose drain current and gate-source voltage Vgs are non-linear. Under the circumstance that channel length modulation effect can be neglected, the drain currents of the input transistor Min1 and the second input transistor Min2 and the input voltage difference $\Delta V_{in}$ can be represented by Eq. 5. In FIG. 2, the drain currents of the first input transistor Min1 and the input transistor Min2 are equivalent to the loading currents $i_1$, and $i_2$, respectively.

$$\Delta V_{in} = V_{in1} - V_{in2} = \sqrt{\frac{2i_1}{\mu_n C_{ox} \frac{W}{L}}} - \sqrt{\frac{2i_2}{\mu_n C_{ox} \frac{W}{L}}} \quad \text{(Eq. 5)}$$

After formula manipulation and simplification, Eq. 5 can be represented as Eq. 6.

$$\frac{1}{2} \mu_n C_{ox} \frac{W}{L}(V_{in1} - V_{in2})^2 - I_{SS} = -2\sqrt{i_1 i_2} \quad \text{(Eq. 6)}$$

In Eq. 6, the source current Iss is equivalent to summation of the loading currents $i_1$ and $i_2$, that is, ($I_{SS}=I_1+I_2$). After formula manipulation and simplification, that is, putting square on both side of Eq. 6 and representing the source current Iss with the loading currents $i_1$ and $i_2$, Eq. 6 can be further conducted to obtain Eq. 7.

$$i_1 - i_2 = \frac{1}{2} \mu_n C_{ox} \frac{W}{L}(V_{in1} - V_{in2}) \sqrt{\frac{4 I_{SS}}{\mu_n C_{ox} \frac{W}{L}} - (V_{in1} - V_{in2})^2} \quad \text{(Eq. 7)}$$

As $i_1-i_2=\Delta I_D$, $V_{in1}-V_{in2}=\Delta V_{in}$, the relations between the loading currents $i_1$, $i_2$ and the input voltage difference $\Delta V_{in}$ can be obtained, which is shown in FIG. 2C. Moreover, the transconductance (Gm) of the differential input pair is equivalent to calculating the differential of the loading current difference ($\Delta I_D=i_1-i_2$) to the input voltage difference $\Delta V_{in}$.

$$G_m = \frac{\partial \Delta I_D}{\partial \Delta V_{in}} = \frac{1}{2} \mu_n C_{ox} \frac{W}{L} \frac{\frac{4 I_{SS}}{\mu_n C_{ox} \frac{W}{L}} - 2\Delta V_{in}^2}{\sqrt{\frac{4 I_{SS}}{\mu_n C_{ox} \frac{W}{L}} - \Delta V_{in}^2}} \quad \text{(Eq. 8)}$$

When the input voltage difference $\Delta V_{in}$ is small, $$\Delta V_{in} \ll \sqrt{\frac{2 I_{SS}}{\mu_n C_{ox} \frac{W}{L}}}$$

is satisfied. Meanwhile, the transconductance (Gm) of the differential input pair can be represented as Eq. 9.

$$G_m = \sqrt{\mu_n C_{ox} \frac{W}{L} I_{ss}} \quad \text{(Eq. 9)}$$

According to Eq. 9, when the input voltage difference is small, relation between the loading currents $i_1$, $i_2$ and the input voltage difference $\Delta V_{in}$ are linear. However, with increment of the input voltage difference $\Delta V_{in}$, Eq. 8 can no longer be conducted to Eq. 9. Therefore, linearity between the loading currents $i_1$, $i_2$ and the input voltage difference becomes worse. Furthermore, since the current of the current source Iss starts to gather at one of the input transistors Min1, Min2, the transconductance Gm becomes to decrease. In a case that the absolute value of the input voltage difference $\Delta V_{in}$ is greater than $\Delta V1$, all the current originating from the current source Iss simultaneously flow to one of the input transistors Min1, Min2, and the differential input pair cannot operate normally, that is, Gm=0. Although the above analyses are based on the operation of the differential input pair having NMOS transistors, analyses for the differential input pair having PMOS transistors can be analogue and not illustrated to avoid redundancy.

FIG. 2C shows a diagram illustrating a relation between the loading currents versus input voltage difference of the differential input stage circuit shown in FIG. 2A. The vertical axis represents the loading current $i_1$, $i_2$ and the horizontal axis represents the input voltage difference $\Delta V_{in}$.

In FIG. 2C, curve Ci1 and curve Ci2 represent the relation between the first and the second loading currents $i_1$, $i_2$ and the input voltage difference $\Delta V_{in}$, respectively. As shown by the curve Ci1, when the input voltage difference $\Delta V_{in}$ is in a relatively small range, the first loading current $i_1$ is relatively proportional to the input voltage difference $\Delta V_{in}$ and there is a linear transfer relation between variance of the first loading current $\Delta i_1$ and the input voltage difference $\Delta V_{in}$. As shown by the curve Ci2, when the input voltage difference $\Delta V_{in}$ is in a relatively small range, the second loading current $i_2$ is relatively inversely proportional to the input voltage difference $\Delta V_{in}$ and there is a negative linear transfer relation between variance of the second loading current $\Delta i_2$ and the input voltage difference $\Delta V_{in}$.

Alternatively speaking, when the input voltage difference input voltage difference $\Delta V_{in}$ becomes larger, the variance degrees of the first loading current $i_1$ and the second loading current $i_2$ decreases, and the transfer relations between the loading currents ($i_1$ and $i_2$) are no longer proportional or inversely proportional to the input voltage difference $\Delta V_{in}$. When the input voltage difference $\Delta V_{in}$ exceeds $+\Delta V1$ (or less than $-\Delta V1$), the first loading current $i_1$ and the second loading current i2 basically remain constant, and hence the differential pair does not work properly under such input voltage condition.

The linear range of a differential pair is especially important for the operational amplifier circuit in a LCD driver circuit. When the input voltage difference of the differential pair exceeds the linear range, the output signal may deviate from the desired value, and hence the image quality provided by the LCD panel is degraded. Therefore, it is an important subject in the industry to design an operational amplifier circuit with extended linear range.

SUMMARY

The disclosure is directed to an operational amplifier circuit and a differential input stage circuit having a linearity enhancement circuit so that the differential input stage can achieve a larger linear range.

According to one embodiment of the invention, an operational amplifier circuit is provided. The operational amplifier circuit includes a differential input stage circuit and a loading stage circuit. The differential input stage circuit includes a first input circuit, a first voltage maintaining circuit and a first current source. The first input circuit further includes a first input transistor and a second input transistor. The first input transistor has a first terminal, a second terminal, and a control terminal for receiving a first input signal, and the second input transistor has a first terminal, a second terminal, and a control terminal for receiving a second input signal. The first voltage maintaining circuit includes a first branch circuit and a second branch circuit. The first branch circuit is coupled to the first terminal and the control terminal of the first input transistor, for receiving the first input signal. The second branch circuit is coupled to the first terminal and the control terminal of the second input transistor, for receiving the second input signal. The first current source is coupled to the second terminals of the first input transistor and the second input transistor. The loading stage circuit is coupled to the first voltage maintaining circuit, for generating a first stage output.

The invention will become apparent from the following detailed description of the preferred but non-limiting embodiments. The following description is made with reference to the accompanying drawings.

Figure 1:
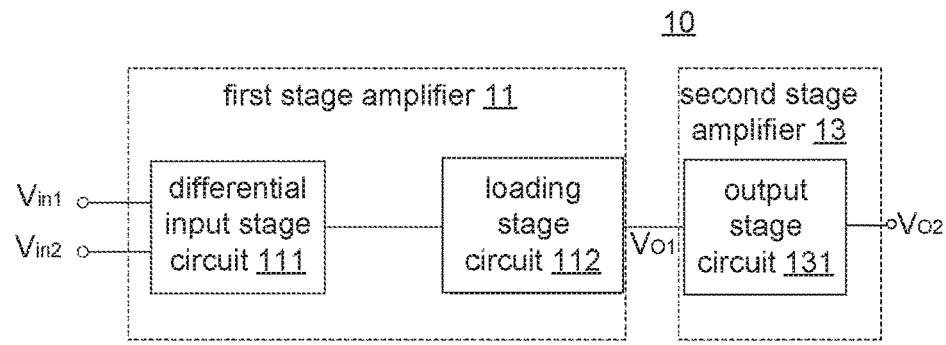
FIG. 1 (prior art) shows a block diagram of an example operational amplifier.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 3A:
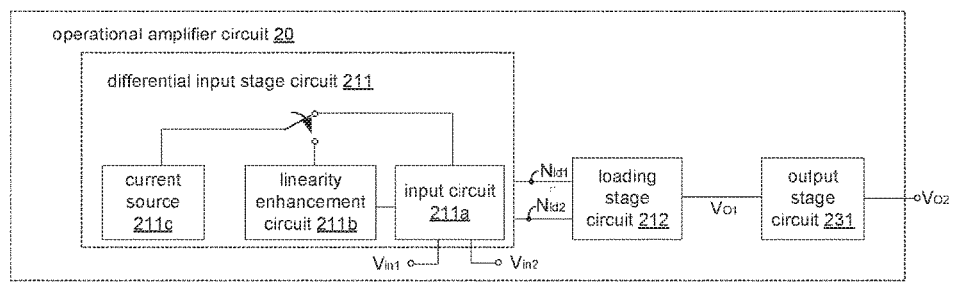
FIG. 3A shows an operational amplifier circuit having a linearity enhancement circuit according to one embodiment of the invention.

FIG. 3A shows an operational amplifier circuit having a linearity enhancement circuit according to one embodiment of the invention. The operational amplifier circuit 20 includes a differential input stage circuit 211, a loading stage circuit 212 and an output stage circuit 231. In addition to an input circuit 211a for receiving the first input signal $V_{in1}$ and the second input signal $V_{in2}$ and a current source 211c, the differential input stage circuit 211 according to an embodiment of the present disclosure further includes a linearity enhancement circuit 211b being coupled to the input circuit 211a.

According to an embodiment of the present disclosure, one of the input circuit 211a and the linearity enhancement circuit 211b is coupled to the loading stage circuit 212 through a first loading terminal Nld1 and a second loading terminal Nld2, and the other of the input circuit 211a and the linearity enhancement circuit 211b is coupled to the current source 211c.

The linearity enhancement circuit 211b can be implemented in different manner, for example, a bias control circuit, a voltage maintaining circuit and so forth. More details regarding implementation of the bias control circuit and the voltage maintaining circuit are used are illustrated below.

The operational amplifier circuit 20 may be used in a display device. For example, the output terminal of the loading stage circuit 212 may be coupled to an output stage circuit 231. The output stage circuit 31 may include power MOSFETs to provide sufficient driving capability. In one embodiment, the output stage circuit 231 is configured to provide a single-ended voltage signal (second stage output $V_{O2}$) for driving a display panel.

Figure 3B:
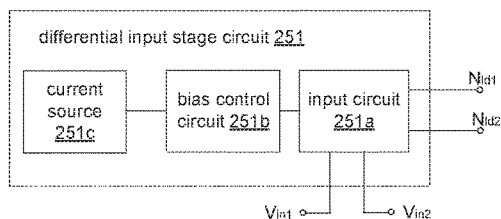
FIG. 3B is a schematic diagram illustrating a bias control circuit is used as the linearity enhancement circuit according to an embodiment of the invention.

FIG. 3B is a schematic diagram illustrating a bias control circuit is used as the linearity enhancement circuit according to an embodiment of the invention. In a case that the linearity enhancement circuit 211b is a bias control circuit 251b, the input circuit 251a is coupled to the first loading terminal Nld1 and the second loading terminal Nld2, and the bias control circuit 251b is coupled to the current source 251c. FIGS. 4A, 4B, 5, 6 and 7 are schematic diagrams related to the embodiment that the differential input stage includes the bias control circuit.

Figure 3C:
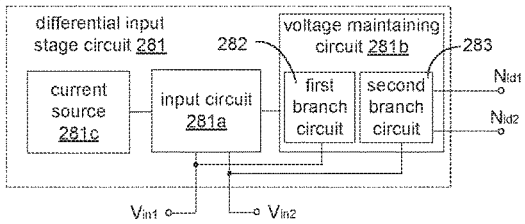
FIG. 3C is a schematic diagram illustrating a voltage maintaining circuit is used as the linearity enhancement circuit according to another embodiment of the invention.

FIG. 3C is a schematic diagram illustrating a voltage maintaining circuit is used as the linearity enhancement circuit according to another embodiment of the invention. In a case that the linearity enhancement circuit 211b is a voltage maintaining circuit 281b, the voltage maintaining circuit 281b is coupled to the first loading terminal Nld1 and the second loading terminal Nld2, and the input circuit 281a is coupled to the current source 281c. Moreover, both the input voltage maintaining circuit 281b and the input circuit 281a receive the first input signal $V_{in1}$ and the second input signal $V_{in2}$.

As shown in FIG. 3C, the voltage maintaining circuit 281b further includes a first branch circuit 282 and a second branch circuit 283. The first branch circuit 282 receives the first input signal $V_{in1}$ and generates the first loading current $i_1$; and the second branch circuit 283 receives the second input signal $V_{in2}$ and generates the second loading current $i_2$. FIGS. 8A, 8B, 9, 10, 11 are schematic diagrams showing that the differential input stage includes a first type of the voltage maintaining circuit, and FIGS. 12, 13, 14 and 15 are diagrams showing that the differential input stage includes a second type of the voltage maintaining circuit.

In the following embodiments, PMOS transistors and NMOS transistors are used for illustration purpose. In practical applications, NMOS transistors may be replaced by NPN-type BJTs, and PMOS transistors may be replaced by PNP-type BJTs. In still another embodiment, other types of transistors such as junction gate field-effect transistor (JFET) may be used instead, or different types of transistors may be used in combination in one differential pair.

Figure 4A:
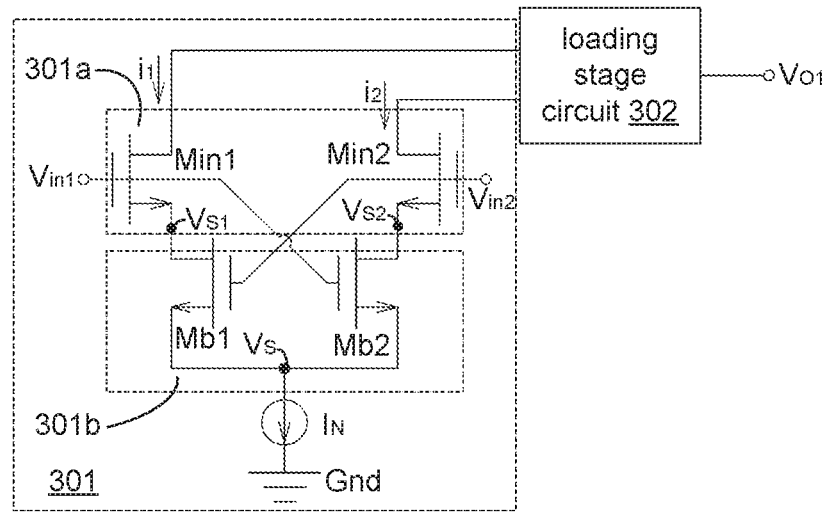
FIG. 4A shows an operational amplifier circuit having a bias control circuit and an NMOS differential pair according to an embodiment of the invention.

FIG. 4A shows an operational amplifier circuit having a bias control circuit and an NMOS differential pair according to an embodiment of the invention. The operational amplifier circuit 30 includes a differential input stage circuit 301 and a loading stage circuit 302. The differential input stage circuit 101 includes a current source $I_N$, an input circuit 301a and a bias control circuit 301b. The input circuit 301a further includes input transistors Min1, Min2, and the bias control circuit 301b further includes transistors Mb1 and Mb2.

The control terminal of the input transistor Min1 receives a first input signal $V_{in1}$. The control terminal of the input transistor Min2 receives a second input signal $V_{in2}$. The first and the second input signals $V_{in1}$, $V_{in2}$ jointly form a pair of differential signal. Transistor Mb1 has a first terminal coupled to the second terminal of the input transistor Min1, a second terminal coupled to the current source $I_N$, and a control terminal coupled to the control terminal of transistor Min2. Transistor Mb2 has a first terminal coupled to the second terminal of transistor Min2, a second terminal coupled to the current source $I_N$, and a control terminal coupled to the control terminal of the input transistor Min1. The loading stage circuit 302 is coupled to the first terminal of the input transistor Min1 and the first terminal of the input transistor Min2, for generating an output signal $V_O$ at an output terminal of the operational amplifier circuit 11b.

In the example shown in FIG. 4A, transistors Min1, Min2, Mb1 and Mb2 are NMOS transistors. The first terminal, the second terminal, and the control terminal of an NMOS transistor may correspond to the drain terminal, the source terminal, and the gate terminal, respectively.

In one embodiment, the sizes (gate width W and gate length L) of the input transistors Min1 and Min2 are substantially equal (represented as $$\left(\frac{W}{L}\right)_1$$

in the following formulas). The sizes of transistors Mb1 and Mb2 are substantially equal (represented as $$\left(\frac{W}{L}\right)_3$$

in the following formulas).

As can be seen in FIG. 4A, the bias voltage of transistor Mb1 is a variable voltage. Similarly, the bias voltage of transistor Mb2 is also a variable voltage. The differential pair shown in FIG. 4 uses a variable bias control mechanism. In this circuit, the input transistors Min1 and Min2 operate in the saturation region. Transistors Mb1 and Mb2 operate in the triode region, acting as variable resistors. Transistors Mb1 and Mb2 are degeneration devices for the input transistors Min1 and Min2 respectively. Transistors Mb1 and Mb2 constitute a feedback loop at the second terminal (source terminal) of the input transistors Min1 and Min2, effectively extending the linear range of the operational amplifier circuit 301.

Refer to FIG. 4A, when the input voltage difference $\Delta V_{in}$ ($\Delta V_{in}=V_{in1}-V_{in2}$) is small, transistors Mb1 and Mb2 operate in the triode region. Taking transistor Mb1 for example, the resistance value between its drain terminal and its source terminal is controlled by the second input signal $V_{in2}$. Similarly, the resistance value between the drain terminal and the source terminal of transistor Mb2 is controlled by the first input signal $V_{in1}$. Consider the situation when the voltage of the first input signal $V_{in1}$ increases and the voltage of the second input signal $V_{in2}$ decreases, the loading current $i_1$ will increase, and the loading current $i_2$ will decrease. Because the resistance value between the drain terminal and the source terminal of transistor Mb1 increases (caused by decreased $V_{in2}$), the increased loading current $i_1$ will increase the voltage across the drain terminal and the source terminal of transistor Mb1. Because of such negative feedback, the increment (the amount that the voltage increases) of the gate-to-source voltage of the input transistor Min1 will be smaller than the increment of the first input signal $V_{in1}$. Therefore, the increment of the loading current $i_1$ decreases. On the other hand, the resistance value between the drain terminal and the source terminal of the input transistor Mb2 decreases (caused by increased $V_{in1}$), the decreased loading current $i_2$ will decrease the voltage across the drain terminal and the source terminal of transistor Mb2. The decrement of the gate-to-source voltage of transistor Min2 will be smaller than the decrement of the second input signal $V_{in2}$. Therefore, the loading current $i_2$ will not decrease rapidly. As described above, when the voltage of the first input signal $V_{in1}$ increases and the voltage of the second input signal $V_{in2}$ decreases, the change in the loading currents $i_1$ and $i_2$ can be kept small, resulting in an improved linear range for the differential pair. The detailed analyses for current and voltage of the circuit shown in FIG. 4A are provided below.

Loading current $i_1$ being calculated by current flowing through transistor Min1:

$$i_1 = \tfrac{1}{2} k_1 (V_{in1} - V_{S1} - V_{t1})^2$$

Loading current $i_1$ being calculated by current flowing through transistor Mb1:

$$i_1 = k_3 (V_{in2} - V_S - V_{t3})(V_{S1} - V_S)$$

Loading current $i_2$ being calculated by current flowing through transistor Min2:

$$i_2 = \tfrac{1}{2} k_2 (V_{in2} - V_{S2} - V_{t2})^2$$

Loading current $i_2$ being calculated by current flowing through transistor Mb2:

$$i_2 = k_4 (V_{in1} - V_S - V_{t4})(V_{S2} - V_S)$$

where $$i_1 + i_2 = I; \; k_1 = k_2 = \mu_n C_{ox}\left(\frac{W}{L}\right)_1; \; k_3 = k_4 = \mu_n C_{ox}\left(\frac{W}{L}\right)_3;$$

$V_S$ is the source voltage of transistor Mb1 and Mb2; $V_{S1}$ and $V_{S2}$ are the source voltages of transistors Min1 and Min2 respectively.

When the input voltage difference $\Delta V_{in}$ is small, transistors Mb1 and Mb2 operate in the triode region, and the source voltages of these four transistors Min1, Min2, Mb1, Mb2 are close. In addition, the threshold voltages of these four transistors Min1, Min2, Mb1, Mb2 are also close. In addition, $V_{t1}=V_{t2}=V_{t3}=V_{t4}=V_t$ may be substituted in the above formulas. After formula manipulation and simplification, the loading currents $i_1$, $i_2$ may be expressed as:

$$i_1 \cong \frac{1}{2} + \sqrt{\mu_n C_{ox}(W/L)_1 I}\left[1 - \frac{3(W/L)_1}{2[(W/L)_1+(W/L)_3]}\right]\left(\frac{\Delta v_{in}}{2}\right) \times \quad \text{(Eq. 10A)}$$
$$\sqrt{1 - \frac{\mu_n C_{ox}(W/L)_1}{I}\left[1 - \frac{3(W/L)_1}{2[(W/L)_1+(W/L)_3]}\right]^2 \left(\frac{\Delta v_{in}}{2}\right)^2}$$

$$i_2 \cong \frac{1}{2} - \sqrt{\mu_n C_{ox}(W/L)_1 I}\left[1 - \frac{3(W/L)_1}{2[(W/L)_1+(W/L)_3]}\right]\left(\frac{\Delta v_{in}}{2}\right) \times \quad \text{(Eq. 10B)}$$
$$\sqrt{1 - \frac{\mu_n C_{ox}(W/L)_1}{I}\left[1 - \frac{3(W/L)_1}{2[(W/L)_1+(W/L)_3]}\right]^2 \left(\frac{\Delta v_{in}}{2}\right)^2}$$

Based on Eq. 10A and Eq. 10B, when $$\frac{\Delta v_{in}}{2} \ll \frac{\sqrt{I/\mu_n C_{ox}(W/L)_1}}{1 - \frac{3(W/L)_1}{2[(W/L)_1+(W/L)_3]}}, \quad \text{(Eq. 11)}$$

the loading currents $i_1$ and $i_2$ may be approximately represented as a linear relation as follows:

$$i_1 \cong \frac{1}{2} + \sqrt{\mu_n C_{ox}(W/L)_1 I}\left[1 - \frac{3(W/L)_1}{2[(W/L)_1+(W/L)_3]}\right]\left(\frac{\Delta v_{in}}{2}\right) \quad \text{(Eq. 12A)}$$

$$i_2 \cong \frac{1}{2} - \sqrt{\mu_n C_{ox}(W/L)_1 I}\left[1 - \frac{3(W/L)_1}{2[(W/L)_1+(W/L)_3]}\right]\left(\frac{\Delta v_{in}}{2}\right) \quad \text{(Eq. 12B)}$$

That is, when the condition in Eq. 11 is satisfied, the relation between the loading current $i_1$ and the input voltage difference $\Delta V_{in}$ is linear. The transconductance Gm of the input stage circuit 301 shown in FIG. 4A is:

$$G_m = \frac{i_1}{\Delta v_{in}/2} = \sqrt{\mu_n C_{ox}(W/L)_1 I}\left[1 - \frac{3(W/L)_1}{2[(W/L)_1+(W/L)_3]}\right] \quad \text{(Eq. 13)}$$

Figure 2A:
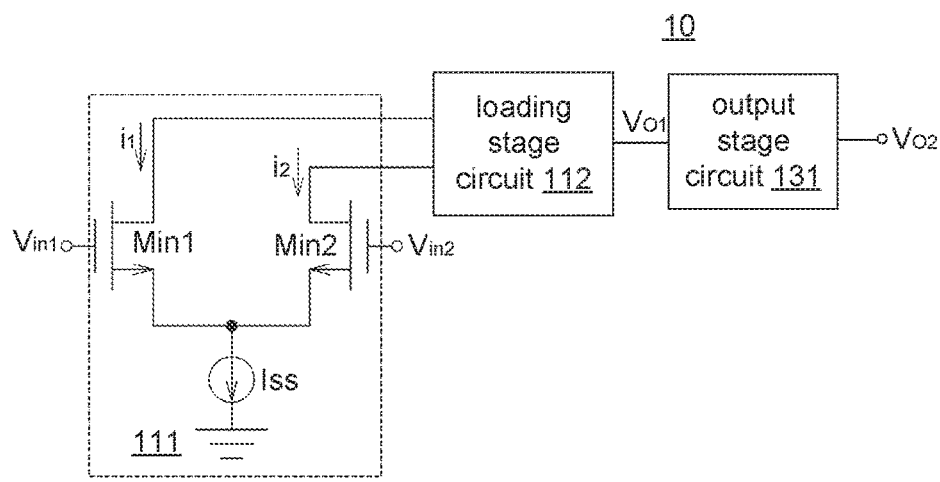
FIG. 2A (prior art) shows a circuit diagram of an example differential input stage circuit.

Comparing Eq. 13 with Eq. 4, the transconductance Gm of the differential pair (four transistor architecture, 4T) as shown in FIG. 4A is $$\left[1 - \frac{3(W/L)_1}{2[(W/L)_1+(W/L)_3]}\right]$$

times of the transconductance Gm of the differential pair (two transistor architecture, 2T) as shown in FIG. 2A (the transconductance Gm is reduced). However, comparing Eq. 11 with Eq. 2, the linear range of the 4T differential pair is $$\frac{1}{\left[1 - \frac{3(W/L)_1}{2[(W/L)_1 + (W/L)_3]}\right]}$$

times of the linear range of the 2T differential pair. In other words, the proposed differential input stage circuit shown in FIG. 4A is able to extend the linear range for the input voltage difference $\Delta V_{in}$. In addition, a desired linear range can be designed by appropriately adjusting the size of the four transistors Mb1, Mb2, Min1, Min2 (adjusting $$\left(\frac{W}{L}\right)_1 \text{ and } \left(\frac{W}{L}\right)_3\right)$$

based on the formula $$\frac{1}{\left[1 - \frac{3(W/L)_1}{2[(W/L)_1 + (W/L)_3]}\right]}.$$

Figure 2B:
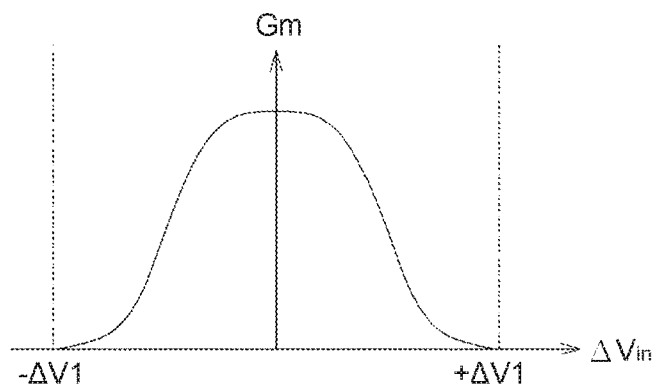
FIG. 2B (prior art) shows a diagram illustrating a transconductance of the differential input stage circuit shown in FIG. 2A.
Figure 4B:
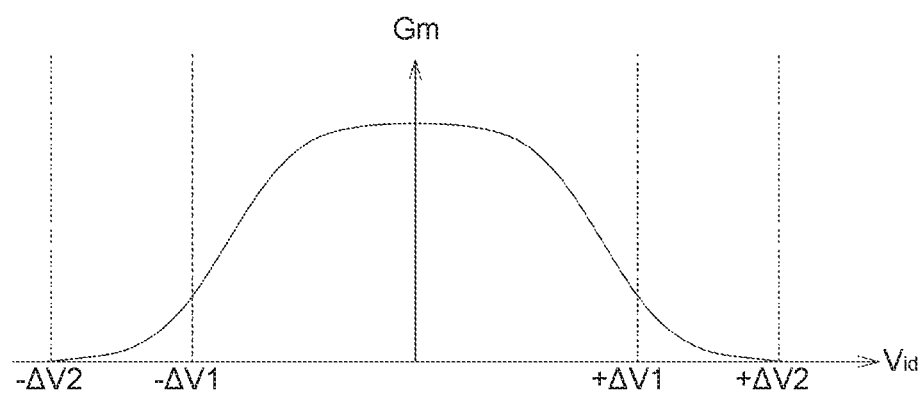
FIG. 4B shows a diagram illustrating a transconductance of the differential input stage circuit shown in FIG. 4A.

FIG. 4B shows a diagram illustrating a transconductance of the differential input stage circuit shown in FIG. 4A. The horizontal axis is the input voltage difference $\Delta V_{in}$. When the input voltage difference $\Delta V_{in}$ exceeds $+\Delta V2$ (or less than $-\Delta V2$), the transconductance Gm becomes 0, and hence the differential pair does not worker properly under such input voltage condition. Compare FIG. 4B with FIG. 2B, the input voltage range that results in a stable transconductance Gm is enlarged in FIG. 4B. $\Delta V2 > \Delta V1$, and hence the linear range of the differential pair is greatly enhanced.

Figure 5:
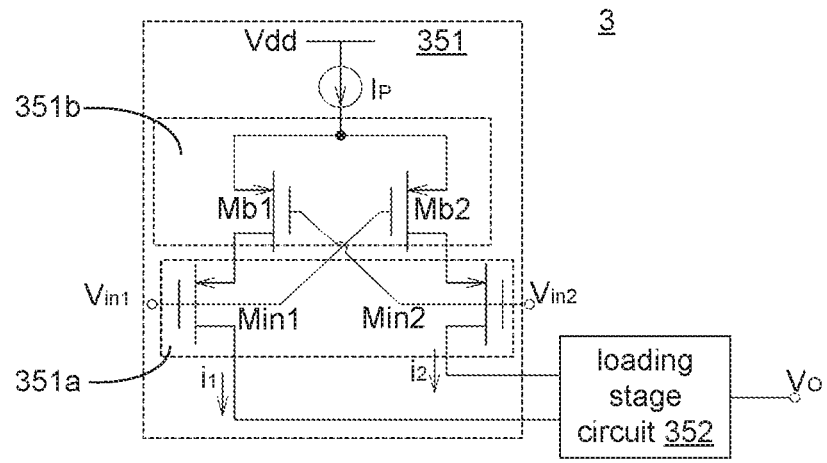
FIG. 5 shows an operational amplifier circuit having a bias control circuit and a PMOS differential pair according to an embodiment of the invention.

In the above embodiment NMOS transistors are used in the differential input stage circuit 301. In another embodiment, the differential input stage circuit 351 may include PMOS transistors instead. FIG. 5 shows an operational amplifier circuit having a bias control circuit and a PMOS differential pair according to an embodiment of the invention. The current source $I_P$ is coupled to a supply voltage Vdd. The connection topology and the operation are similar to those in FIG. 4A and thus are not repeated herein. In this embodiment, transistors Min1, Min2, Mb1, Mb2 are PMOS transistors. The first terminal, the second terminal, and the control terminal of a PMOS transistor may correspond to the drain terminal, the source terminal, and the gate terminal, respectively.

Figure 6:
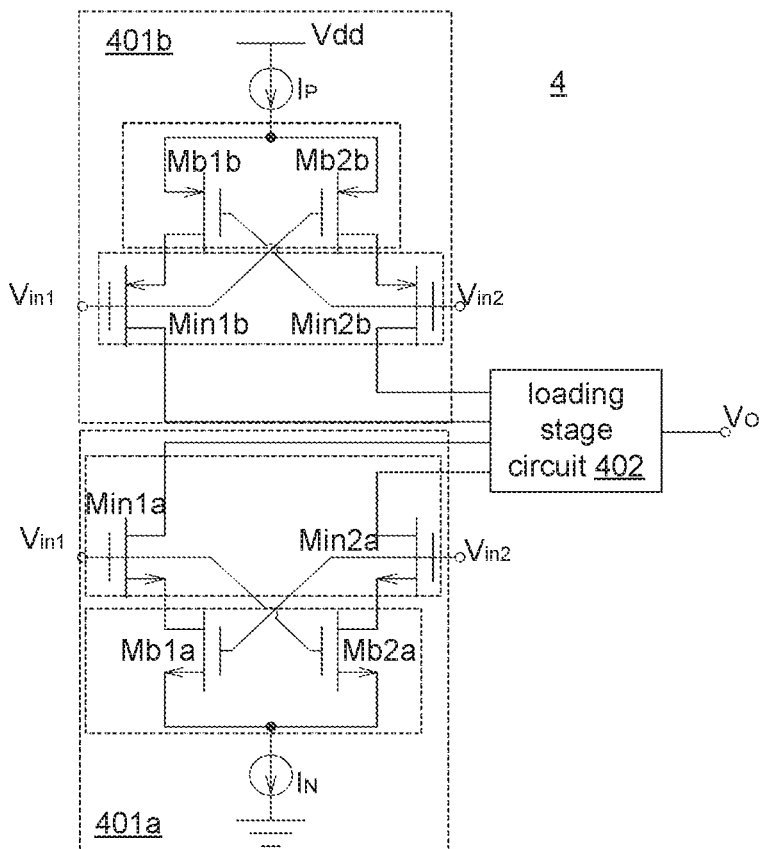
FIG. 6 shows a rail-to-rail operational amplifier circuit having bias control circuits according to an embodiment of the invention.

FIG. 6 shows a rail-to-rail operational amplifier circuit having bias control circuits according to an embodiment of the invention. In addition to transistors Min1a, Min2a, Mb1a, Mb2a in which interconnections are similar to the ones shown in FIG. 4A, the differential input stage circuit 401b in FIG. 6 also includes a first complementary current source $I_P$ and complementary transistors Min1b, Min2b, Mb1b and Mb2b. The complementary transistor Min1b has a first terminal, a second terminal, and a control terminal for receiving the first input signal $V_{in1}$. The complementary transistor Min2b has a first terminal, a second terminal, and a control terminal for receiving the second input signal $V_{in2}$. The complementary transistor Mb1b has a first terminal coupled to the second terminal of the complementary transistor Min1b, a second terminal coupled to the first complementary current source $I_P$, and a control terminal coupled to the control terminal of the complementary transistor Min2b. The complementary transistor Mb2b has a first terminal coupled to the second terminal of the complementary transistor Min2b, a second terminal coupled to the first complementary current source $I_P$, and a control terminal coupled to the control terminal of the complementary transistor Min1b. The loading stage circuit 402 is coupled to the first terminal of the complementary transistor Min1b and the first terminal of the complementary transistor Min2b.

The gate terminal of transistor Min1a and the gate terminal of the complementary transistor Min1b are coupled together. The gate terminal of transistor Min2a and the gate terminal of the complementary transistor Min2b are also coupled together. The connection relation between complementary transistors Min1b, Min2b, Mb1b, Mb2b is similar to that shown in FIG. 5. The rail-to-rail operational amplifier circuit 4 is able to provide a wider dynamic range for input signals and output signals.

In one embodiment, the sizes of the complementary transistors MP1 and MP2 are substantially equal. The sizes of the complementary transistors MP3 and MP4 are substantially equal.

Figure 7:
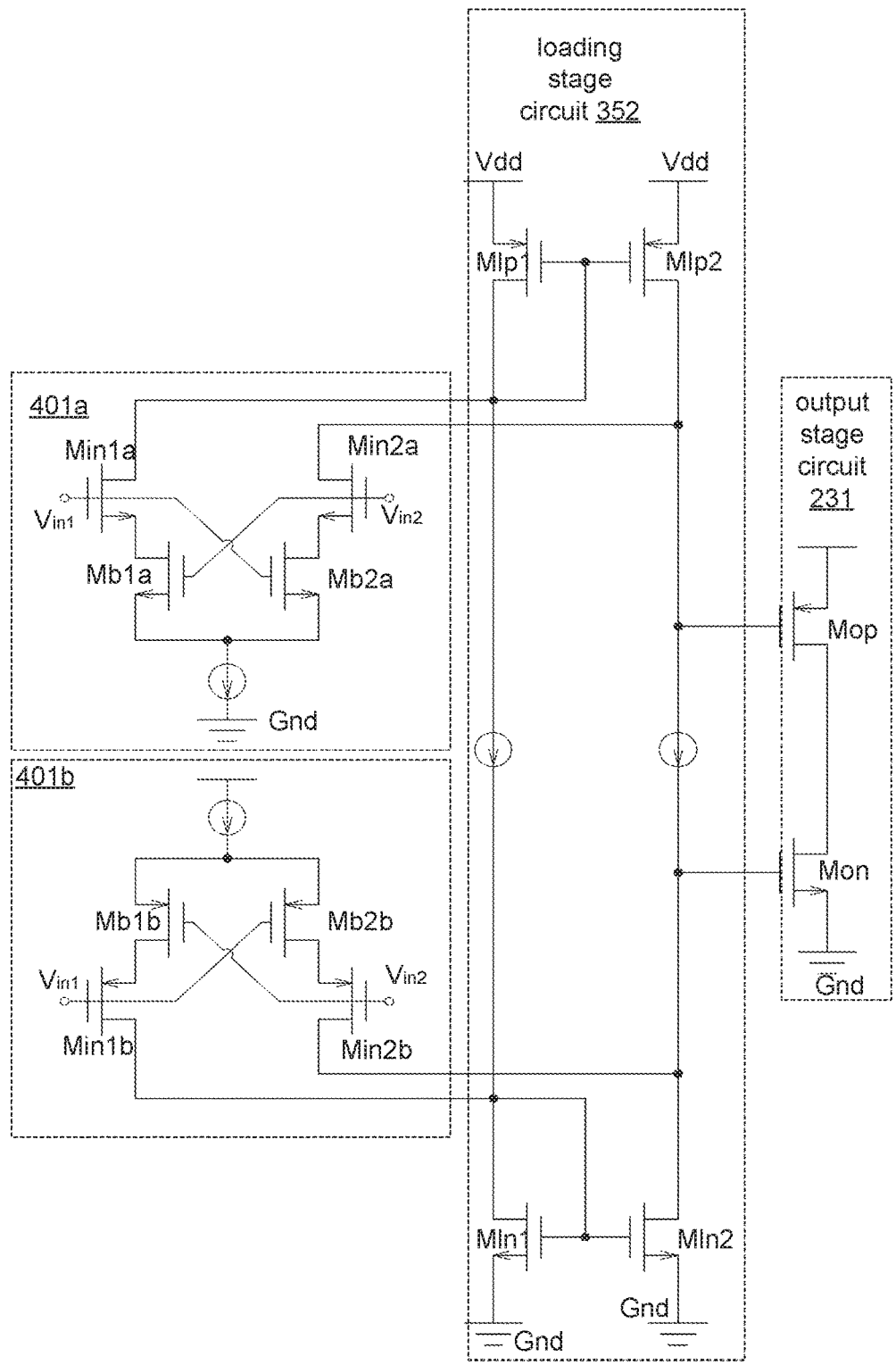
FIG. 7 shows an example implementation of the loading stage circuit and the output stage circuit together with the rail-to-rail architecture shown in FIG. 6.

FIG. 7 shows an example implementation of the loading stage circuit and the output stage circuit together with the rail-to-rail architecture shown in FIG. 6. The loading stage circuit 102 in this example includes the NMOS transistors Mln1, Mln2 and PMOS transistors Mlp1, Mlp2. The output stage circuit 103 in this example includes the NMOS transistor Mon and PMOS transistor Mop. FIG. 7 shows merely an exemplary implementation. The circuit architecture for different applications may be modified correspondingly based on the design constraints, such as the voltage gain and bandwidth requirements.

According to another embodiment of the present disclosure, a voltage maintaining circuit is provided for tracking an input common mode voltage Vcm of the differential input pair so that the differential pair operates at the boundary of the triode region and the saturation region. The input common mode voltage Vcm of the differential input pair is equivalent to an average of the first input signal $V_{in1}$ and the second input signal Vin2.

Figure 8A:
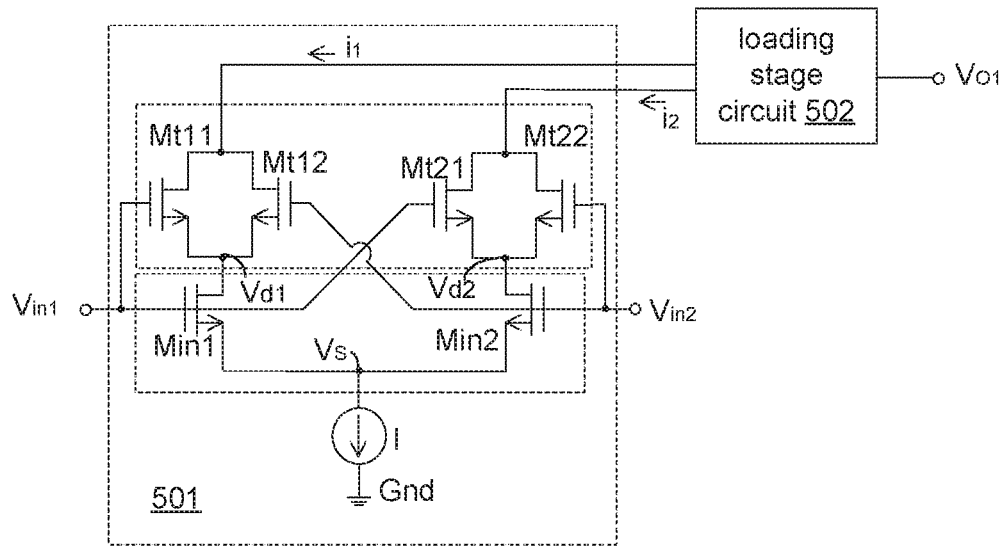
FIG. 8A shows an operational amplifier circuit having a voltage maintaining circuit and an NMOS differential pair according to an embodiment of the invention.

FIG. 8A shows an operational amplifier circuit having a voltage maintaining circuit and an NMOS differential pair according to an embodiment of the invention. The control terminal of the first input transistor Min1 receives a first input signal $V_{in1}$. The control terminal of the second input transistor Min2 receives a second input signal $V_{in2}$. The first and the second input signals $V_{in1}$, $V_{in2}$ jointly form a pair of the differential input signals $V_{in1}$, $V_{in2}$.

The first branch circuit includes transistors Mt11 (first tracking transistor) and Mt12 (second tracking transistor), and the second branch circuit includes transistors Mt21 (third tracking transistor) and Mt22 (fourth tracking transistor).

The first terminals of transistors Mt11, Mt12, Mt21 and Mt22 are coupled to the loading stage circuit. The control terminals of transistors Mt11 and Mt21 are coupled to the control terminal of the first input transistor Min1. The control terminals of transistors Mt12 and Mt22 are coupled to the control terminal of the second input transistor Min2. The second terminals of transistors Mt11 and Mt12 are coupled to the first terminal of the first input transistor Min1. The second terminals of transistors Mt21 and Mt22 are coupled to the first terminal of the second input transistor Min2.

The loading stage circuit 502 is coupled to the first terminals of the transistors Mt11, Mt12, Mt21, Mt22, for generating an output signal $V_O$ at an output terminal of the operational amplifier circuit 50.

In the example shown in FIG. 8A, transistors Min1, Min2, Mb1 and Mb2 are NMOS transistors. The first terminal, the second terminal, and the control terminal of an NMOS transistor may correspond to the drain terminal, the source terminal, and the gate terminal, respectively.

In one embodiment, the sizes (gate width W and gate length L) of the input transistors Min1 and Min2 are substantially equal (represented as $$\left(\frac{W}{L}\right)_1$$

in the following formulas). The sizes of transistors Mt11 and Mt12 are substantially equal (represented as $$\left(\frac{W}{L}\right)_3$$

in the following formulas). The sizes of transistors Mt21 and Mt22 are substantially equal (represented as $$\left(\frac{W}{L}\right)_5$$

in the following formulas).

Refer to FIG. 8A, when the input voltage difference $\Delta V_{in}$ ($\Delta V_{in}=V_{in1}-V_{in2}$) is small, voltages of the second terminal of transistors Mt11 and Mt12 basically remain constant due to the characteristic of the differential pair. That is, a virtual ground phenomenon exists at the first terminals of the first input transistor Min1 and the second input transistor Min2. Due to the virtual ground phenomenon, voltages of the first terminals of the first and the second input transistors, that is, Vd1 and Vd2, can be remained constantly. The voltage of the first terminal Vd1 of the first input transistor Min1 can be obtained by subtracting the gate-to-source voltage Vgs of the first input transistor Mt11 from an input common mode voltage Vcm. Similarly, the voltage of the first terminal Vd2 of the second input transistor Min2 can be obtained by subtracting the gate-to-source voltage Vgs of the second input transistor Mt22 from the input common mode voltage Vcm.

Based on the constant voltages at their first terminals, both the first input transistor Min1 and the second input transistor Min2 are controlled to operate at the boundary of the triode region and the saturation region. Because both the first input transistor Min1 and the second input transistor Min2 operate in the triode region and the saturation region, the linearity of the differential input pair is better. Therefore, the design of the voltage maintaining circuit can improve linearity of the differential pair.

By assuming threshold voltages of all transistors in FIG. 8A are equivalent, the current and voltage of the circuit shown in FIG. 8A is provided below.

Firstly, the first input transistor Min1 operates in the triode region, and the loading current i1 can be calculated by the current flowing through the first input transistor Min1 as represented below, in which $$k_1 = \mu_n C_{ox} \left(\frac{W}{L}\right)_1$$

Loading current $i_1$ being calculated by current flowing through transistor Min1: $i_1=i_1=k_1(V_{in1}-V_S-V_t)(V_{d1}-V_S)$ For the first branch circuit, the first branch current Ib1 is equivalent to summation of the first part of loading current $i_{d11}$ as the current flowing through transistor Mt11 and the second part of loading current $i_{d12}$ as the current flowing through transistor Mt12, that is, $i_{b1}=i_{d11}+i_{d12}$. Transistors Mt11 and Mt12 operate in the saturation region, and the currents flowing through transistors Mt11 and Mt12 are shown below, together with the first branch current Ib1. In the following formulas, $$k_3 = \mu_n C_{ox}\left(\frac{W}{L}\right)_3, \text{ and } k_5 = \mu_n C_{ox}\left(\frac{W}{L}\right)_5.$$

First part of loading current $i_{d11}$ being calculated by current flowing through transistor Mt11; $i_{d11}=\frac{1}{2}k_3(V_{in1}-V_{d1}-V_t)^2$ Second part of loading current $i_{d12}$ being calculated by current flowing through transistor Mt12; $i_{d12}=\frac{1}{2}k_5(V_{in2}-V_{d1}-V_t)^2$ Loading current $i_{b1}$ being calculated by current flowing through the first branch circuit: $i_{b1}=i_{d11}+i_{d12}=\frac{1}{2}k_3(V_{in1}-V_{d1}-V_t)^2+\frac{1}{2}k_5(V_{in2}-V_{d1}-V_t)^2$ Similarly, the second input transistor Min2 operates in the triode region, and the drain current of the second input transistor Min2 can be represented below, in which $$k_2 = \mu_n C_{ox}\left(\frac{W}{L}\right)_1$$

Loading current being calculated by current flowing through transistor Min2: $i_2=k_2(V_{in2}-V_S-V_t)(V_{d2}-V_S)$ For the second branch circuit, the second branch current $i_{b2}$ is equivalent to summation of the first part of loading current $i_{d21}$ as the current flowing through transistor Mt21 and the second part of loading current $i_{d22}$ as the current flowing through transistor Mt22, that is, $i_{b2}=i_{d21}+i_{d22}$. The currents flowing through transistors Mt11 and Mt12 are shown below, together with the first branch current $i_{b1}$. In the following formulas, $$k_4 = \mu_n C_{ox}\left(\frac{W}{L}\right)_3, \text{ and } k_5 = \mu_n C_{ox}\left(\frac{W}{L}\right)_5.$$

First part of loading current $i_{d21}$ being calculated by current flowing through transistor Mt21: $i_{d21}=\frac{1}{2}k_4(V_{in1}-V_{d2}-V_t)^2$ Second part of loading current $i_{d22}$ being calculated by current flowing through transistor Mt22: $i_{d22}=\frac{1}{2}k_6(V_{in2}-V_{d2}-V_t)^2$ Loading current $i_{b2}$ being calculated by current flowing through the second branch circuit: $i_{b2}=i_{d21}+i_{d22}=\frac{1}{2}k_4(V_{in1}-V_{d2}-V_t)^2+\frac{1}{2}k_6(V_{in2}-V_{d2}-V_t)^2$ In one embodiment, the sizes of transistors Min1*a* and Min2*a* are substantially equal. The sizes of transistors Mt11*a*, Mt12*a*, Mt21*a* and Mt22*a* are substantially equal.

$$i_1 = \frac{1}{2} + \frac{K}{2}\sqrt{k_1 I}\left(\frac{\Delta V_{in}}{2}\right)\sqrt{1 - \frac{\left(\frac{\Delta V_{in}}{2}\right)^2}{\frac{4I}{K^2 k_1}}} \quad \text{(Eq. 14A)}$$

$$i_2 = \frac{1}{2} - \frac{K}{2}\sqrt{k_1 I}\left(\frac{\Delta V_{in}}{2}\right)\sqrt{1 - \frac{\left(\frac{\Delta V_{in}}{2}\right)^2}{\frac{4I}{K^2 k_1}}} \quad \text{(Eq. 14B)}$$

In Eq. 14A and Eq. 14B, K is less than 1 and can be represented by k1, k2, k3, k4, and k5, as shown by Eq. 15.

$$K = \frac{k_1^2 + 2k_3^2 + 3k_1 k_3 - 3k_1 k_5}{k_1^2 + k_3^2 + k_5^2 + 2k_1 k_3 + 2k_1 k_5 + 2k_3 k_5} \quad \text{(Eq. 15)}$$

Based on Eq. 14A and Eq. 14B, when $$\frac{\Delta V_{in}}{2} \ll \frac{2}{K}\sqrt{\frac{1}{k_1}} = \frac{2}{K}\sqrt{\frac{I}{\mu_n C_{ox}\left(\frac{W}{L}\right)_1}}, \quad \text{(Eq. 16)}$$

the drain currents i1 and i2 may be approximately represented as a linear relation as follows:

$$i_1 \cong \frac{1}{2} + \frac{K}{2}\sqrt{k_1 I}\left(\frac{\Delta V_{in}}{2}\right) \quad \text{(Eq. 17A)}$$

$$i_2 \cong \frac{1}{2} - \frac{K}{2}\sqrt{k_1 I}\left(\frac{\Delta V_{in}}{2}\right) \quad \text{(Eq. 17B)}$$

That is, when the condition in Eq. 16 is satisfied, the relation between the drain currents and the input voltage difference $\Delta V_{in}$ is linear. The transconductance (Gm) of the differential input pair shown in FIG. 8A is:

$$G_m = \frac{i_1}{\Delta V_{in}/2} = \frac{K}{2}\sqrt{k_1 I} = \frac{K}{2}\sqrt{\mu_n C_{OX}(W/L)_1 I} \quad \text{(Eq. 18)}$$

Comparing Eq. 17 with Eq. 4, the transconductance Gm of the differential pair (six transistor architecture, 6T) as shown in FIG. 8A is K/2 times of the transconductance Gm of the differential pair (two transistor architecture, 2T) as shown in FIG. 2A (the transconductance Gm in FIG. 8A is reduced to less than half of the transconductance Gm in FIG. 2A). As defined in Eq. 15, K is always smaller than "1". Based on the scheme shown in FIG. 8A, range of the input voltage difference $\Delta V_{in}$ can be increased to 2/K times under the circumstance that the differential input pair having same linearity. As K is smaller than 1, the multiple 2/K is greater than 2, which implies that range of the input voltage difference $\Delta V_{in}$ is increased by at least two times. In addition, a desired linear range can be designed by appropriately adjusting aspect ratios of transistors Min1, Min2, Mt11, Mt12, Mt21, Mt22.

Figure 2C:
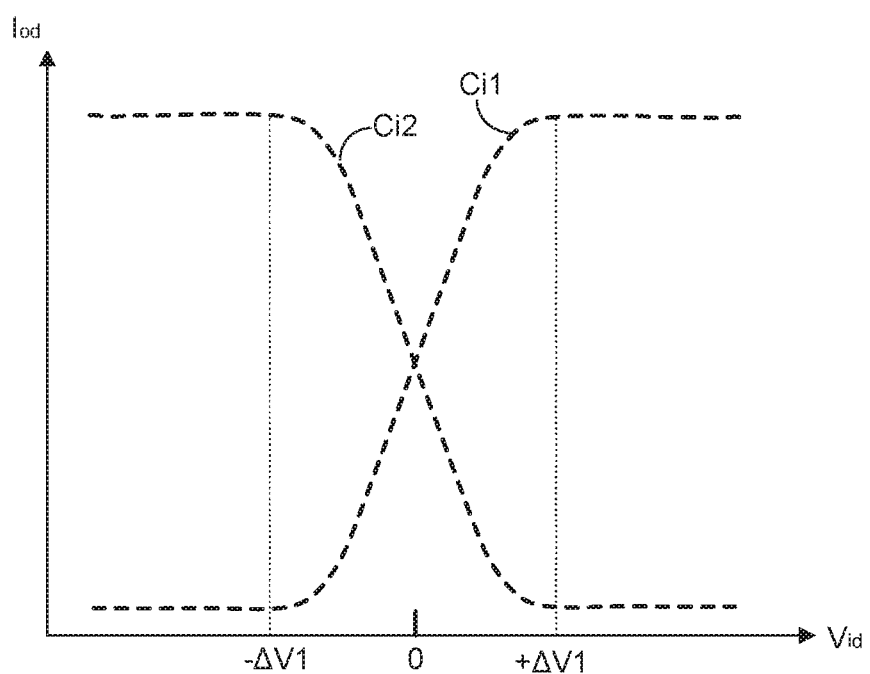
FIG. 2C (prior art) shows a diagram illustrating a relation between loading currents versus input voltage difference of the differential input stage circuit shown in FIG. 2A.
Figure 8B:
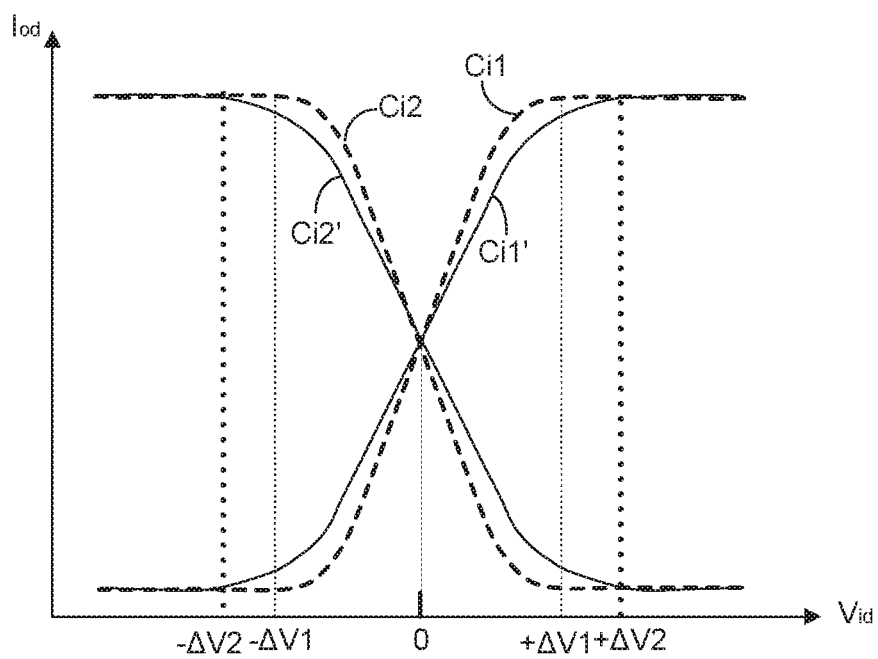
FIG. 8B shows a diagram illustrating the loading currents versus input voltage difference of the differential input stage circuit shown in FIG. 8A.

FIG. 8B shows a diagram illustrating the loading currents versus input voltage difference of the differential input stage circuit shown in FIG. 8A. The horizontal axis is the input voltage difference $\Delta V_{in}$. When the input voltage difference $\Delta V_{in}$ exceeds $+\Delta V2$ (or less than $-\Delta V2$), the loading currents $i_1$, $i_2$ become constant, and hence the differential pair does not worker properly under such input voltage condition. Compare FIG. 8B with FIG. 2C, the input voltage range that results in a relation corresponding to a constant slope is enlarged in FIG. 8B. $\Delta V2 > \Delta V1$, and hence the linear range of the differential pair is greatly enhanced.

In the above embodiment NMOS transistors are used in the differential input stage circuit 501.

Figure 9:
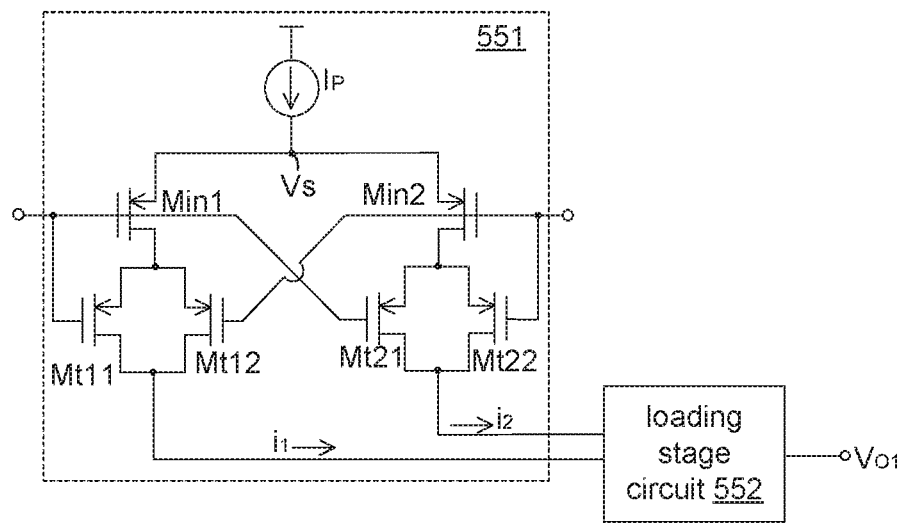
FIG. 9 shows an operational amplifier circuit having a voltage maintaining circuit and a PMOS differential pair according to an embodiment of the invention.

FIG. 9 shows an operational amplifier circuit having a voltage maintaining circuit and a PMOS differential pair according to an embodiment of the invention. The connection topology and the operation are similar to those in FIG. 8A and thus are not repeated herein. In this embodiment, transistors Min1, Min2, Mt11, Mt12, Mt21 and Mt22 are PMOS transistors. The first terminal, the second terminal, and the control terminal of a PMOS transistor may correspond to the drain terminal, the source terminal and the gate terminal, respectively.

In one embodiment, the sizes of the input transistors Min1a and Min2a are substantially equal. The sizes of transistors Mt1111a, Mt12a, Mt21a and Mt22a are substantially equal.

Figure 10:
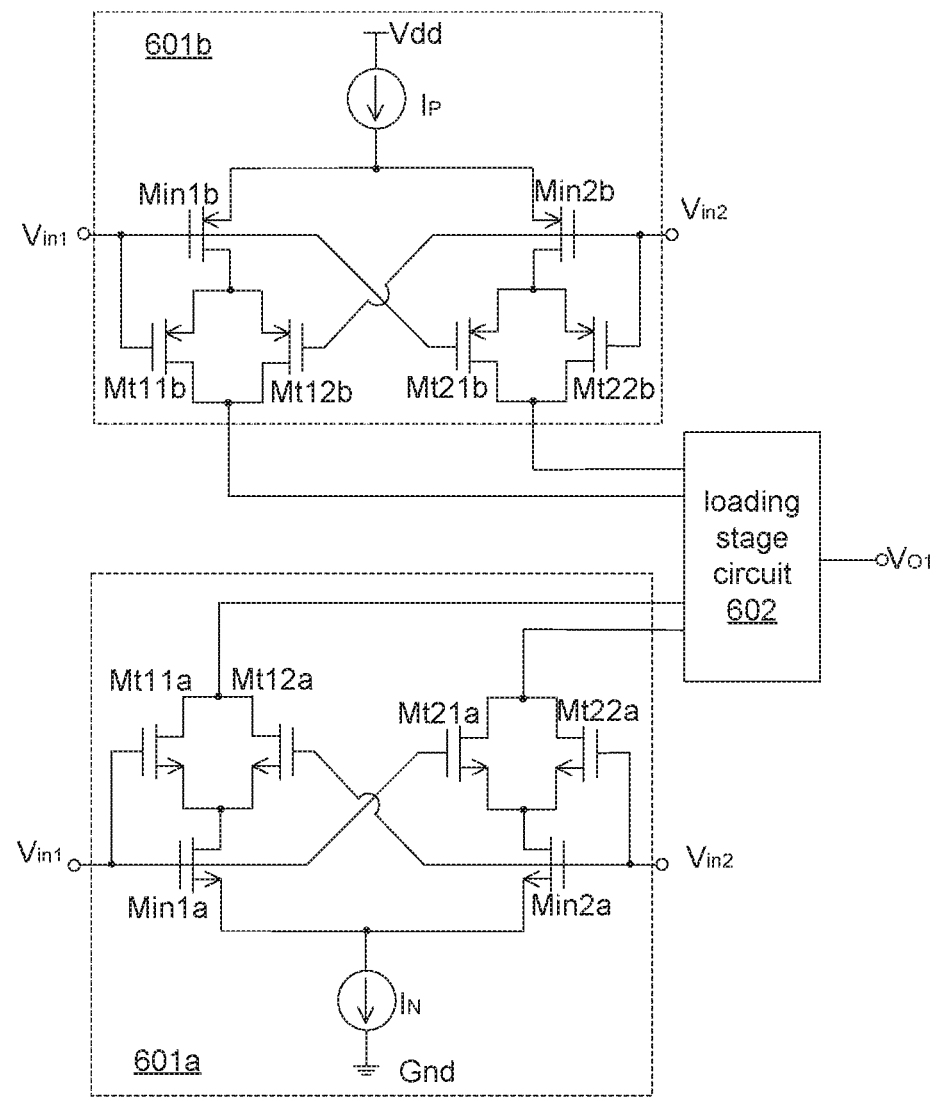
FIG. 10 shows a rail-to-rail operational amplifier circuit having voltage maintaining circuits according to an embodiment of the invention.

FIG. 10 shows a rail-to-rail operational amplifier circuit having voltage maintaining circuits according to an embodiment of the invention. The rail-to-rail operational amplifier circuit 60 is able to provide a wider dynamic range for input signals and output signals. As shown in FIG. 10, the differential input stage includes two complement portions, that is, a first portion and a second portion. In FIG. 10, the first portion and the second portion are assumed to be the lower part and the upper part of the differential input stage circuit, respectively.

In FIG. 10, the first portion of the differential input stage is similar to the circuit shown in FIG. 8A and includes a first input circuit, a first voltage maintaining circuit, and a current source. The first input circuit includes the input transistors Min1a and Min2a, the first voltage maintaining circuit includes transistors Mt1111a, Mt12a, Mt21a and Mt22a.

In FIG. 10, the second portion of the differential input stage is similar to the circuit shown in FIG. 9 and includes a second input circuit, a second voltage maintaining circuit, and a second current source. The second input circuit includes the input transistors Min1b and Min2b, and the second voltage maintaining circuit includes transistors Mt11b, Mt12b, Mt21b and Mt22b.

Figure 11:
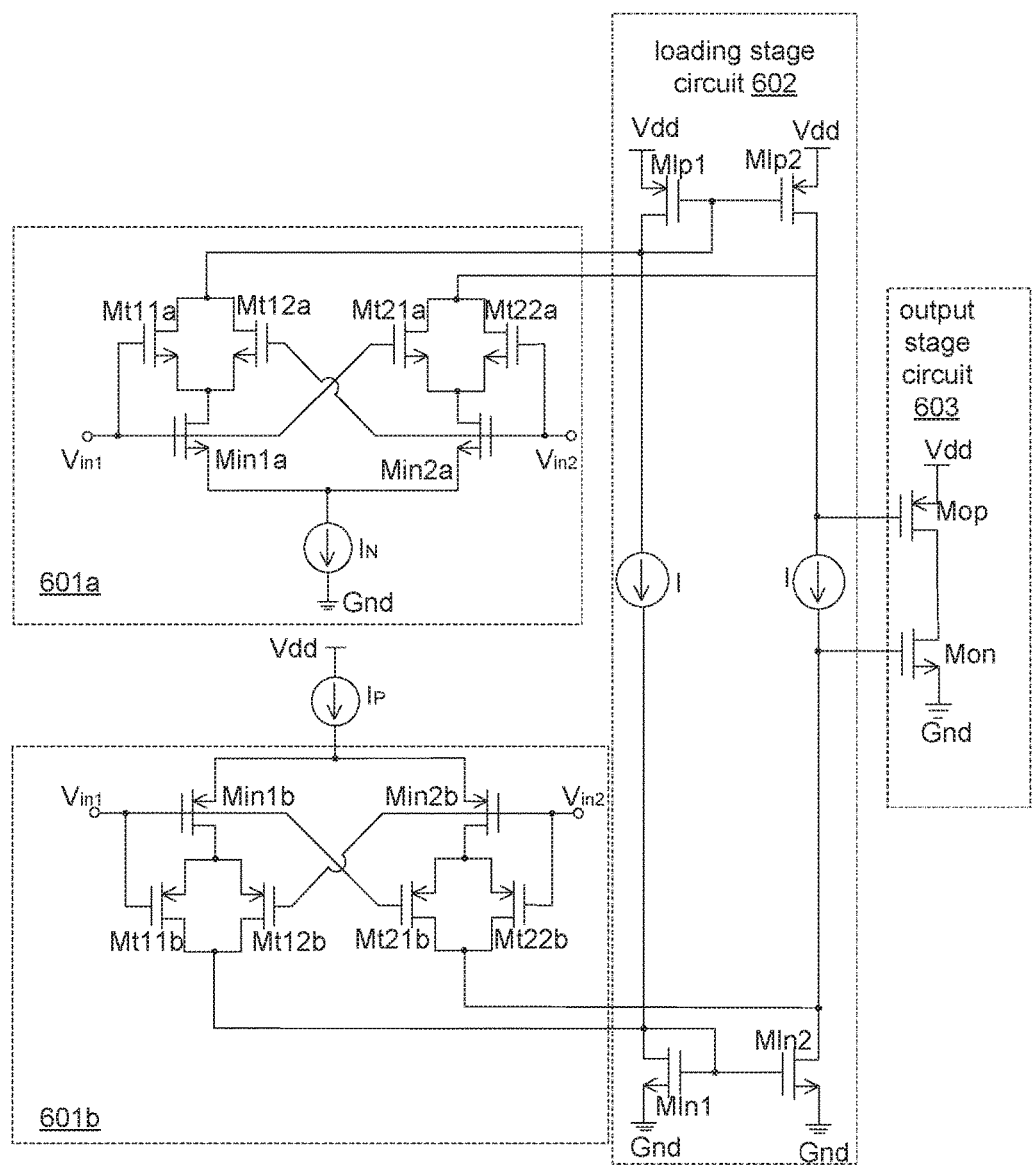
FIG. 11 shows an example implementation of the loading stage circuit and the output stage circuit together with the rail-to-rail architecture shown in FIG. 10.

FIG. 11 shows an example implementation of the loading stage circuit and the output stage circuit together with the rail-to-rail architecture shown in FIG. 10. The loading stage circuit 102 in this example includes the NMOS transistors Mln1, Mln2 and PMOS transistors MPlp1, Mlp26. The output stage circuit 103 in this example includes the NMOS transistor Mon and PMOS transistor Mop. FIG. 11 shows merely an exemplary implementation. The circuit architecture for different applications may be modified correspondingly based on the design constraints, such as the voltage gain and bandwidth requirements.

Figure 12:
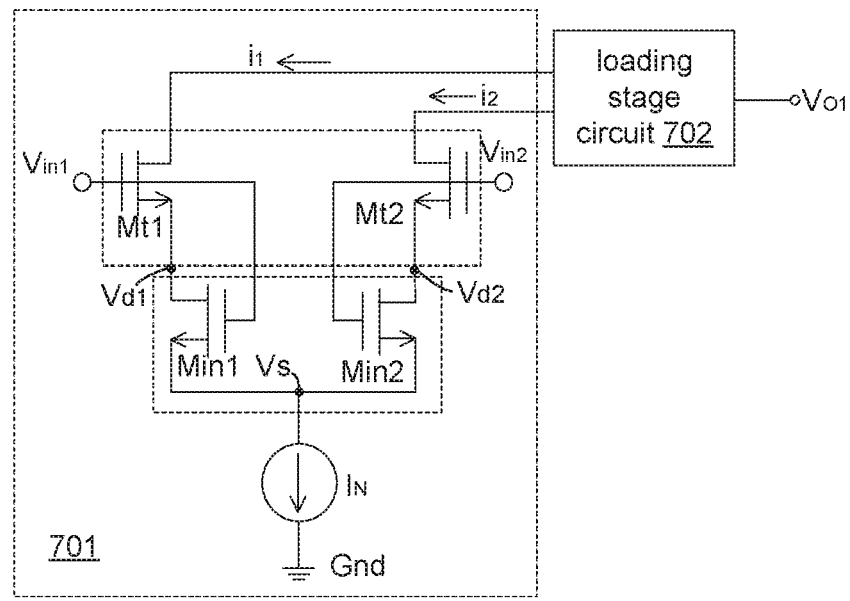
FIG. 12 shows an operational amplifier circuit having a voltage maintaining circuit and an NMOS differential pair according to another embodiment of the invention.

In order to reduce the amount of transistors in the voltage maintaining circuit, the circuit shown in FIG. 8A and be modified to obtain FIG. 12. FIG. 12 shows an operational amplifier circuit having a voltage maintaining circuit and an NMOS differential pair according to another embodiment of the invention.

The first branch circuit includes a transistor Mt1 (as a first tracking transistor) and the second branch circuit includes a transistor Mt2 (as a second tracking transistor). The first terminals of transistors Mt1 and Mt2 are coupled to the loading stage circuit 702. The control terminal of transistor Mt1 is coupled to the control terminal of the first input transistor Min1. The control terminal of transistor Mt2 is coupled to the control terminal of the second input transistor Min2. The second terminal of transistor Mt1 is coupled to the first terminal of the first input transistor Min1. The second terminal of transistor Mt2 is coupled to the first terminal of the second input transistor Min2.

In FIG. 12, the voltage of the first terminal of first input transistor (Min1) Vd1 can be obtained by subtracting the gate-to-source voltage Vgs of the first input transistor Mt1 from the first input signal Vin1, and the voltage of the first terminal of the second input transistor (Min2) Vd2 can be obtained by subtracting the gate-to-source voltage Vgs of the second input transistor Mt2 from the second input signal Vin2.

When the input voltage changes, difference between the first input signal Vin1 and the drain terminal of the first input transistor Min1 is the gate-to-source voltage Vgs of transistor Mt1, which implies that the first input transistor Min1 operates at the boundary of the triode region and the saturation region. Similarly, difference between the second input signal Vin2 and the drain terminal of the second input transistor Min2 is the gate-to-source voltage Vgs of transistor Mt2, and the second input transistor Min2 operates at the boundary of the triode region and the saturation region as well. Because both the first input transistor Min1 and the second input transistor Min2 operate at he the triode region and the saturation region, the linearity of FIG. 12 is better, compared with the ones in FIG. 2A.

Figure 13:
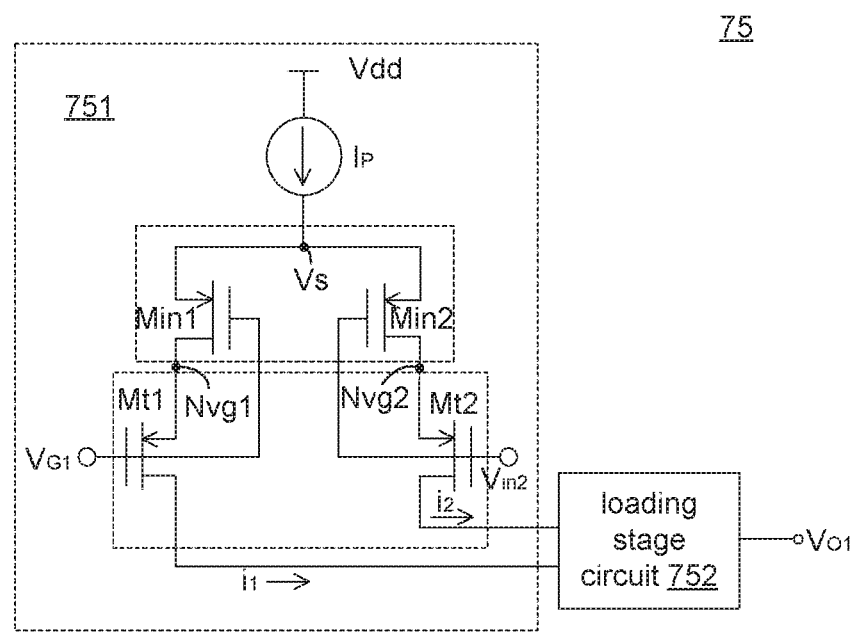
FIG. 13 shows an operational amplifier circuit having a voltage maintaining circuit and a PMOS differential pair according to another embodiment of the invention.

FIG. 13 shows an operational amplifier circuit having a voltage maintaining circuit and a PMOS differential pair according to another embodiment of the invention. The connection topology and the operation are similar to those in FIG. 12 and thus are not repeated herein. In this embodiment, transistors Min1, Min2, Mt11, Mt1 and Mt2 are PMOS transistors. The first terminal, the second terminal, and the control terminal of a PMOS transistor may correspond to the drain terminal, the source terminal, and the gate terminal, respectively.

Figure 14:
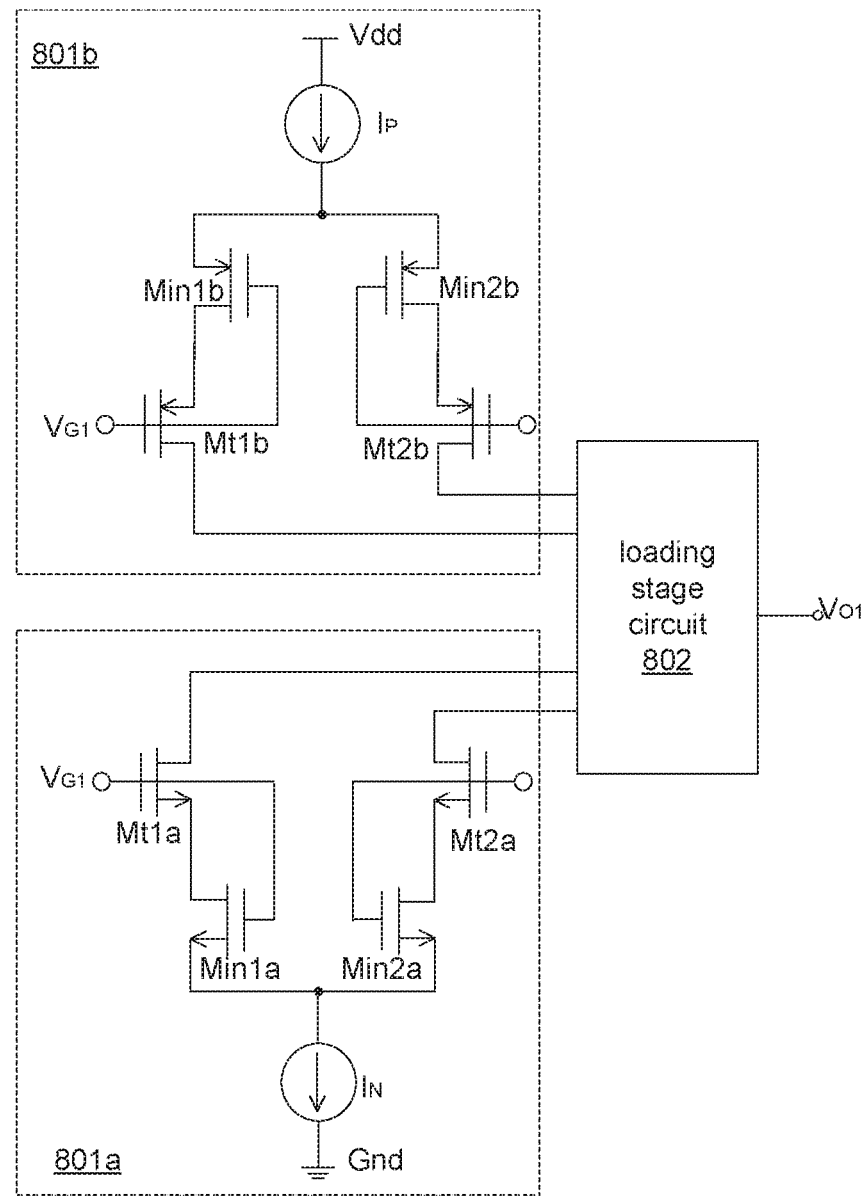
FIG. 14 shows a rail-to-rail operational amplifier circuit having voltage maintaining circuits according to another embodiment of the invention.

FIG. 14 shows a rail-to-rail operational amplifier circuit having voltage maintaining circuits according to another embodiment of the invention. The rail-to-rail operational amplifier circuit 80 is able to provide a wider dynamic range for input signals and output signals. As shown in FIG. 14, the differential input stage includes two complement portions, that is, a first portion and a second portion. In FIG. 14, the first portion and the second portion are assumed to be the lower part and the upper part of the differential input stage circuit, respectively.

In FIG. 14, the first portion of the differential input stage circuit is similar to the circuit shown in FIG. 12 and includes a first input circuit, a first voltage maintaining circuit, and a current source. The first input circuit includes the input transistors Min1a and Min2a, the first voltage maintaining circuit includes transistors Mt1a, Mt2a.

In FIG. 14, the second portion of the differential input stage is similar to the circuit shown in FIG. 13 and includes a second input circuit, a second voltage maintaining circuit, and a second current source. The second input circuit includes the input transistors Min1b and Min2b, and the second voltage maintaining circuit includes transistors Mt1b, Mt2b.

Figure 15:
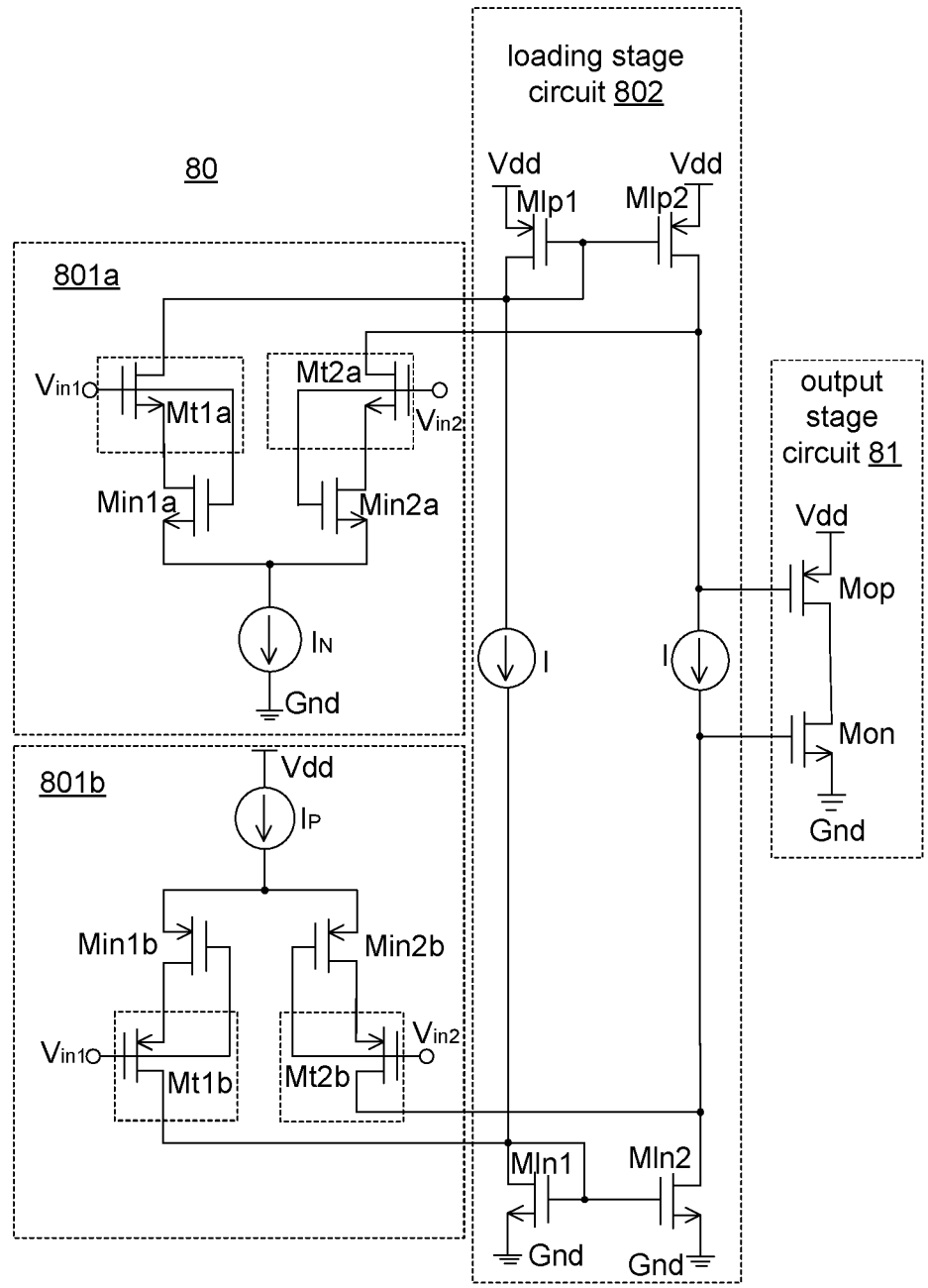
FIG. 15 shows an example implementation of the loading stage circuit and the output stage circuit together with the rail-to-rail architecture shown in FIG. 14.

FIG. 15 shows an example implementation of the loading stage circuit and the output stage circuit together with the rail-to-rail architecture shown in FIG. 14. The loading stage circuit 802 in this example includes the NMOS transistors Mln1, Mln2 and PMOS transistors Mlp1, Mlp2. The output stage circuit 103 in this example includes the NMOS transistor Mon and PMOS transistor Mop. FIG. 15 shows merely an exemplary implementation. The circuit architecture for different applications may be modified correspondingly based on the design constraints, such as the voltage gain and bandwidth requirements.

In LCD driver applications, an operational amplifier circuit may include multiple differential pairs to achieve voltage interpolation function. Such circuit design can reduce chip area and production cost. In some applications, more differential pairs may be accommodated. The loading stage circuit is not illustrated in following figures for simplicity reason.

Figure 16:
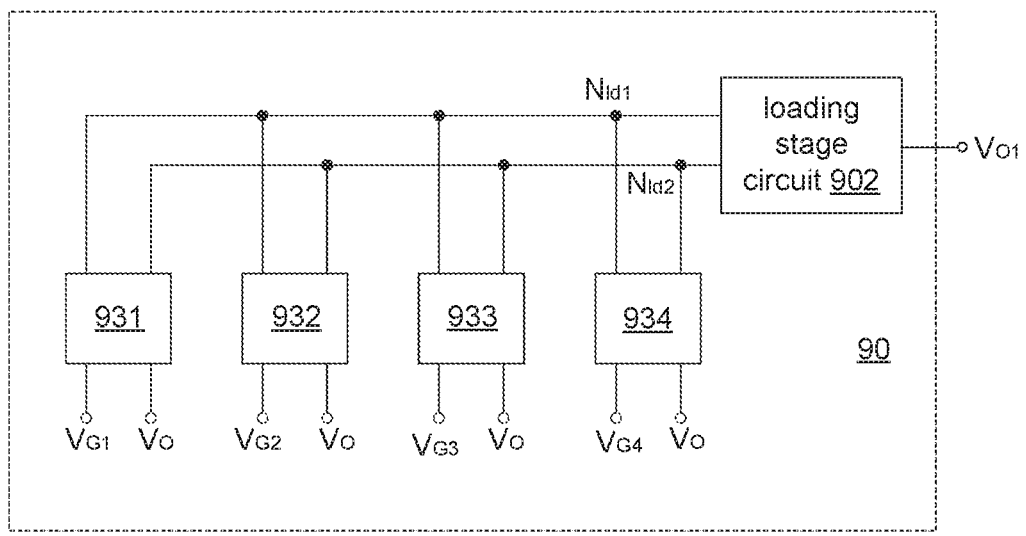
FIG. 16 shows an operational amplifier circuit including multiple differential pairs according to one embodiment of the invention.

FIG. 16 shows an operational amplifier circuit including multiple differential pairs according to one embodiment of the invention. In this example, the differential input stage circuit 90 includes four differential pairs 931-934. Note that the number of total differential pairs may be other numbers, four differential pairs illustrated in this example is just exemplary rather than limiting. The first differential pair 931 receives an input signal $V_{G1}$ and the output signal $V_o$ fed back from the loading stage circuit 102. Similarly, the second differential pair 932 receives another input signal $V_{G2}$ and the output signal $V_o$. The output signal $V_o$ is an interpolation result of the input signals $V_{G1}$-$V_{G4}$. By adopting the above mentioned 4T and/or 6T architecture in the differential pairs 931-934, the extended linear range helps to reduce the output error of the operational amplifier circuit 9.

According to the embodiments given above, the operational amplifier circuit can effectively extend the linear range for the input voltage difference $\Delta V_{in}$. The extended linear range can be designed to a desired value by appropriately adjusting the transistor size. In addition, the operational amplifier circuit can include multiple 4T and/or 6T differential pairs to achieve voltage interpolation function.

Figure 17A:
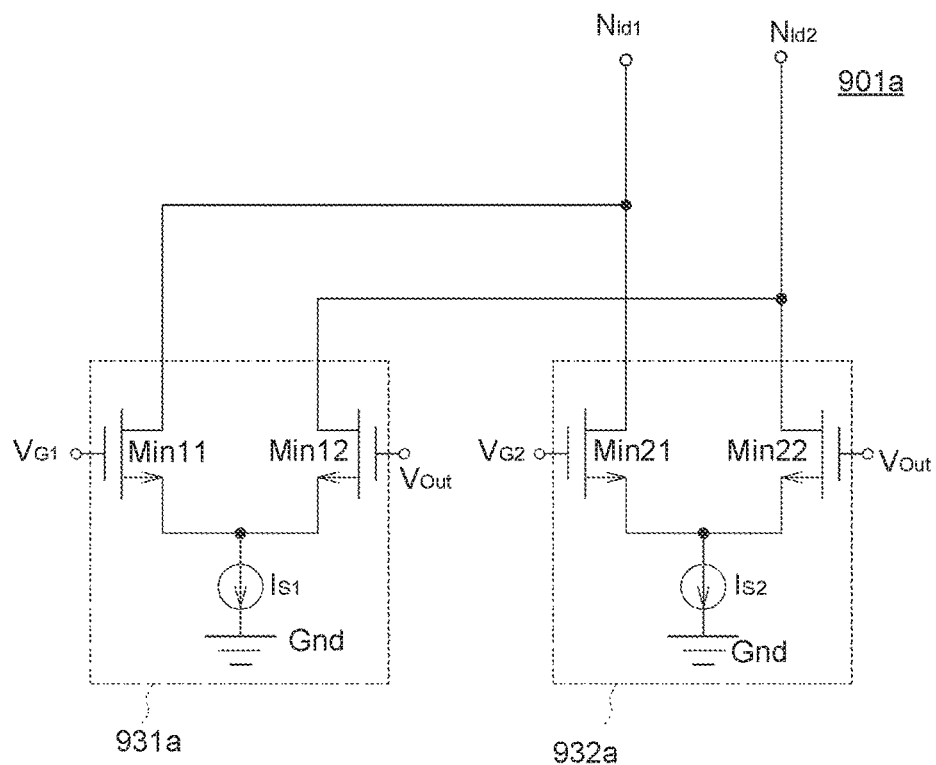
FIG. 17A shows a differential input stage circuit with voltage interpolation function according to one embodiment of the invention.
Figures 18A, 18B:
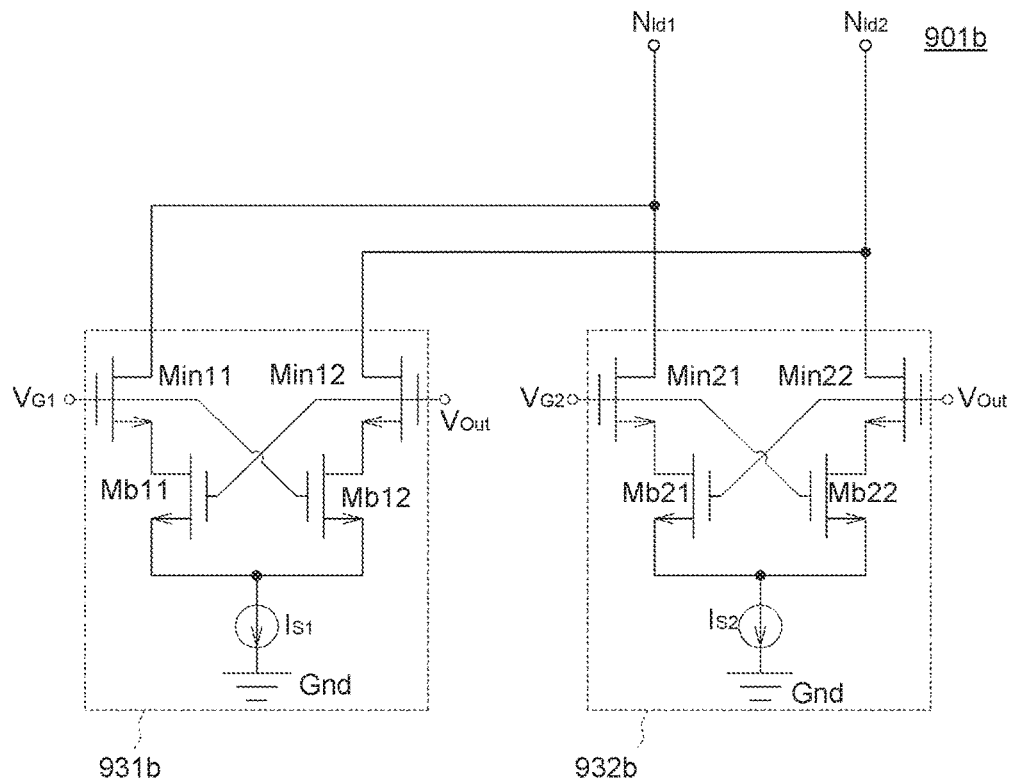
FIG. 18A shows a differential input stage circuit with voltage interpolation function according to one embodiment of the invention.
FIG. 18B shows the voltage levels of signals shown in FIG. 18A.
Figures 19A, 19B:
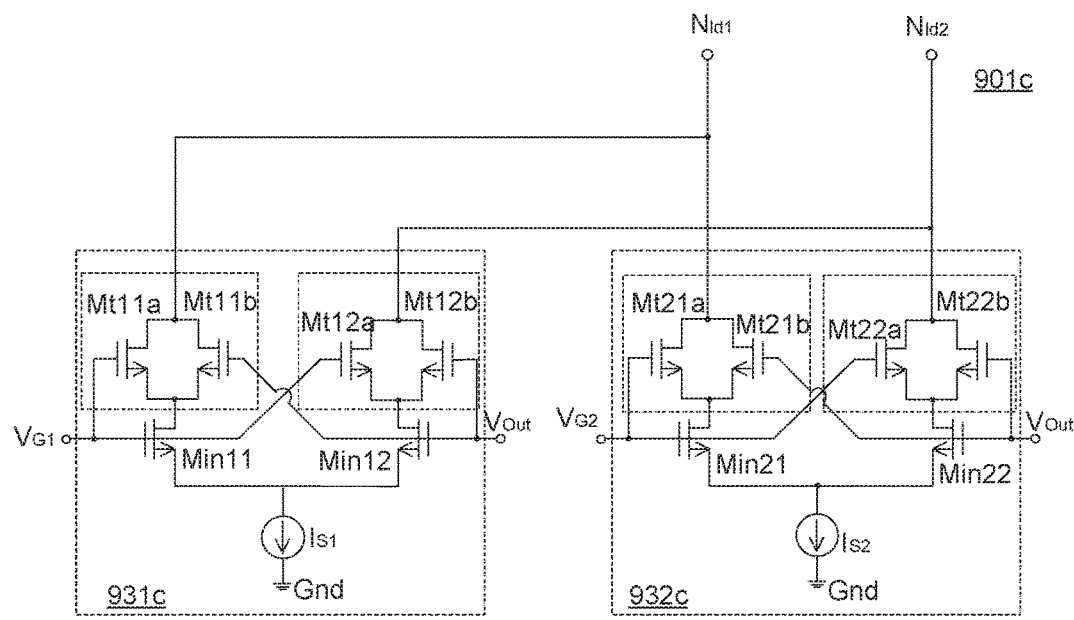
FIG. 19A shows a differential input stage circuit with voltage interpolation function according to another embodiment of the invention.
FIG. 19B shows the voltage levels of signals shown in FIG. 19A.

To further illustrate the concept that how differential pairs in the differential input stage circuit are placed in parallel, two differential pairs are illustrated in the examples shown in FIG. 17A, 18A and FIG. 19A.

FIG. 17A is corresponding the case regarding the differential input stage circuit uses the bias control circuit. FIGS. 18A and 19A are corresponding to the cases regarding the differential input stage circuit uses the first type and the second type of the voltage maintaining circuit, respectively.

FIG. 17A shows a differential input stage circuit with voltage interpolation function according to one embodiment of the invention. The differential input stage circuit 901a includes a first differential pair 931a and a second differential pair 932a. The differential input stage circuit 901a is utilized for interpolating input signals $V_{G1}$ and $V_{G2}$ to generate the output signal $V_{Out}$ according to a superposition principle. The output signal $V_{Out}$ of the differential operational amplifier is fed back to the differential input stage circuit 901a in this example.

The transconductance of the first differential pair 931a is Gm1, and the transconductance of the second differential pair 932a is Gm2. By the superposition principle, the output signal $V_{Out}$ may be expressed as:

$$V_{Out} = \frac{Gm1 \times V_{G1} + Gm2 \times V_{G2}}{Gm1 + Gm2} \tag{Eq. 19}$$

Figure 17B:
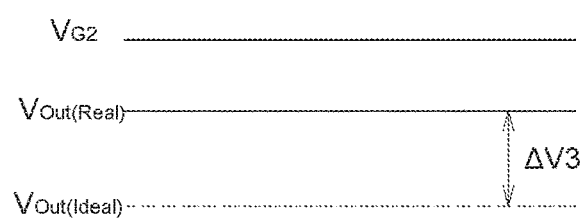
FIG. 17B shows the voltage levels of signals shown in FIG. 17A.

Gm1=Gm2 in an ideal case ($V_O$=0.5×$V_{G1}$+0.5×$V_{G2}$). However, refer to FIGS. 2A and 2B, the linear range of the 2T differential pair is relatively small. Consequently, $Gm1 \neq Gm2$ when the voltage difference between the input signals $V_{G1}$ and $V_{G2}$ is large. Therefore the real output signal $V_{Out}$ deviates from the ideal value. FIG. 17B shows the voltage levels of signals shown in FIG. 17A. There is an error $\Delta V3$ between the ideal output and the real output signal.

FIG. 18A shows a differential input stage circuit with voltage interpolation function according to one embodiment of the invention. The differential input stage circuit 901*b* includes two subsets, a first subset including a current source $I_{S1}$ and transistors Min11, Min12, Mb11, Mb12, and a second subset including a current source $I_{S2}$ and transistors Min21, Min22, Mb21, Mb22. All components and interconnections in both the first and the second subsets are connected as the ones shown in FIG. 4A.

In FIG. 18A, the control terminal of transistor Min21 receives the input signal $V_{G2}$, and the control terminal of transistor Min22 receives the output signal $V_{Out}$. In FIG. 18A, the control terminals of the input transistors Min12 and Min22 are assumed to be coupled together to accomplish the voltage interpolation function. Accordingly, the output signal $V_{Out}$ is an interpolation result of the input signals $V_{G1}$ and $V_{G2}$. The interpolation formula has been shown in the example of FIG. 17A.

In one embodiment, transistors Min21, Min22, Mb21, Mb22 are NMOS transistors, which are of the same type as transistors Min11, Min12, Mb11, Mb12. In one embodiment, the sizes of transistors Min21 and Min22 are substantially equal. The size of transistors Mb21 and Mb22 are substantially equal.

Because 6T differential pairs are used in the example in FIG. 18A, the linear range for input voltage difference $\Delta V_{in}$ is extended. As a result, the difference between the transconductance Gm1 of the first differential pair 931*b* and the transconductance Gm2 of the second differential pair 932*b* becomes smaller. The real output signal $V_{Out(Real)}$ will be closer to the ideal output signal $V_{Out(Ideal)}$.

FIG. 18B shows the voltage levels of signals shown in FIG. 18A. There is an error $\Delta V4$ between the ideal output and the real output signal. As compared to FIG. 17B, $\Delta V4 < \Delta V3$. The extended linear range for the differential pair improves the accuracy of the voltage interpolation result.

FIG. 19A shows a differential input stage circuit with voltage interpolation function according to another embodiment of the invention. The differential input stage circuit 901*c* includes two subsets, a first subset including a current source $I_{S1}$ and transistors Min11, Min12, Mt11*a*, Mt11*b*, Mt12*a*, Mt12*b*, and a second subset including a current source $I_{S2}$ and transistors Min21, Min22, Mt21*a*, Mt21*b*, Mt22*a*, Mt22*b*. All components and interconnections in both the first and the second subsets are connected as the ones shown in FIG. 8A.

In FIG. 19A, the control terminals of transistors Min21 and Mt21*a* receives the input signal $V_{G2}$, and the control terminals of transistors Min22, Mt22*b* receives the output signal $V_{Out}$. In FIG. 19A, the control terminals of the input transistors Min12 and Min22 are assumed to be coupled together to accomplish the voltage interpolation function. Accordingly, the output signal $V_{Out}$ is an interpolation result of the input signals $V_{G1}$ and $V_{G2}$. The interpolation formula has been shown in the example of FIG. 17A.

In one embodiment, transistors Min21, Min22, Mt21*a*, Mt21*b*, Mt22*a*, Mt22*b* are NMOS transistors, which are of the same type as transistors Min11, Min12, Mt11*a*, Mt11*b*, Mt12*a*, Mt12*b*. In one embodiment, the sizes of transistor Min21 and Min22 are substantially equal. The sizes of transistors Mt21*a*, Mt21*b*, Mt22*a* and Mt22*b* are substantially equal.

Because 6T differential pairs are used in the example in FIG. 19A, the linear range for input voltage difference $\Delta V_{in}$ is extended. As a result, the difference between the transconductance Gm1 of the first differential pair 931*c* and the transconductance Gm2 of the second differential pair 932*c* becomes smaller. The real output signal will be closer to the ideal output signal.

FIG. 19B shows the voltage levels of signals shown in FIG. 19A. There is an error $\Delta V5$ between the ideal output and the real output signal. As compared to FIG. 17B, $\Delta V5 < \Delta V3$. The extended linear range for the differential pair improves the accuracy of the voltage interpolation result.

In LCD driver applications, the operational amplifier circuit is often preceded by a digital-to-analog converter (DAC). The proposed operational amplifier circuit adopts different structures to allow a larger range for the input voltage difference. Therefore the resolution requirement for the preceding DAC can be relaxed. In other words, the hardware cost for the DAC circuit can be effectively reduced because of the extended linear range of the proposed operational amplifier circuit.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operational amplifier circuit, comprising:
   a differential input stage circuit, comprising:
   a first input circuit, comprising:
   a first input transistor, having a first terminal, a second terminal, and a control terminal for receiving a first input signal; and
   a second input transistor, having a first terminal, a second terminal, and a control terminal for receiving a second input signal; and
   a second input circuit, comprising:
   a third input transistor, having a first terminal, a second terminal, and a control terminal for receiving a third input signal; and
   a fourth input transistor, having a first terminal, a second terminal, and a control terminal for receiving a fourth input signal;
   a first voltage maintaining circuit, comprising:
   a first branch circuit, coupled to the first terminal and the control terminal of the first input transistor, wherein the first branch circuit receives the first input signal; and
   a second branch circuit, coupled to the first terminal and the control terminal of the second input transistor, wherein the second branch circuit receives the second input signal;
   a first current source, coupled to the second terminals of the first input transistor and the second input transistor;
   a second voltage maintaining circuit, comprising
   a third branch circuit, coupled to the first terminal and the control terminal of the third input transistor, wherein the third branch circuit receives the third input signal; and
   a fourth branch circuit, coupled to the first terminal and the control terminal of the fourth input transistor, wherein the fourth branch circuit receives the fourth input signal; and a second current source, coupled to the second terminals of the third input transistor and the fourth input transistor; and a loading stage circuit, coupled to the first voltage maintaining circuit and the second voltage maintaining circuit, for generating a first stage output.

2. The operational amplifier circuit according to claim 1, wherein the first input signal and the third input signal are identical, and the second input signal and the fourth input signal are identical.

3. The operational amplifier circuit according to claim 2, wherein
the first input transistor and the third input transistor are complement;
the second input transistor and the fourth input transistor are complement; and
the first voltage maintaining circuit and the second voltage maintaining circuit are complement.

4. The operational amplifier circuit according to claim 1, wherein
the first branch circuit comprises a first tracking transistor and a second tracking transistor, and the second branch circuit comprises a third tracking transistor and a fourth tracking transistor, wherein each of the first tracking transistor, the second tracking transistor, the third tracking transistor and the fourth tracking transistor comprises a first terminal, a second terminal, and a control terminal.

5. The operational amplifier circuit according to claim 4, wherein
the first terminals of the first tracking transistor, the second tracking transistor, the third tracking transistor and the fourth tracking transistor are coupled to the loading stage circuit;
the control terminals of the first tracking transistor and the third tracking transistor are coupled to the control terminal of the first input transistor for receiving the first input signal;
the control terminals of the second tracking transistor and the fourth tracking transistor are coupled to the control terminal of the second input transistor for receiving the second input signal;
the second terminals of the first tracking transistor and the second tracking transistor are coupled to the first terminal of the first input transistor; and
the second terminals of the third tracking transistor and the fourth tracking transistor are coupled to the first terminal of the second input transistor.

6. The operational amplifier circuit according to claim 4, wherein a size of the first input transistor is substantially equal to a size of the second input transistor, a size of the first tracking transistor is substantially equal to a size of the second tracking transistor, and a size of the third tracking transistor is substantially equal to a size of the fourth tracking transistor.

7. The operational amplifier circuit according to claim 4, wherein
the first input transistor, the second input transistor, the first tracking transistor, the second tracking transistor, the third tracking transistor, and the fourth tracking transistor are NMOS transistors; or the first input transistor, the second input transistor, the first tracking transistor, the second tracking transistor, the third tracking transistor, and the fourth tracking transistor are PMOS transistors.

8. The operational amplifier circuit according to claim 1, wherein the first branch circuit comprises a first tracking transistor and the second branch circuit comprises a second tracking transistor, wherein each of the first tracking transistor and the second tracking transistor comprises a first terminal, a second terminal, and a control terminal.

9. The operational amplifier circuit according to claim 8, wherein
the first terminals of the first tracking transistor and the second tracking transistor are coupled to the loading stage circuit;
the control terminal of the first tracking transistor is coupled to the control terminal of the first input transistor for receiving the first input signal;
the control terminal of the second tracking transistor is coupled to the control terminal of the second input transistor for receiving the second input signal;
the second terminal of the first tracking transistor is coupled to the first terminal of the first input transistor; and
the second terminal of the second tracking transistor is coupled to the first terminal of the second input transistor.

10. The operational amplifier circuit according to claim 8, wherein a size of the first input transistor is substantially equal to a size of the second input transistor, and a size of the first tracking transistor is substantially equal to a size of the second tracking transistor.

11. The operational amplifier circuit according to claim 8, wherein
the first input transistor, the second input transistor, the first tracking transistor, and the second tracking transistor are NMOS transistors; or
the first input transistor, the second input transistor, the first tracking transistor, and the second tracking transistor are PMOS transistors.

12. The operational amplifier circuit according to claim 1, further comprising:
an output stage circuit, coupled to the loading stage circuit, for receiving the first stage output and generating a second stage output.

13. The operational amplifier circuit according to claim 1, wherein
a first loading current flows from the loading stage circuit to the first input circuit through the first branch circuit, and a second loading current flows from the loading stage circuit to the first input circuit through the second branch circuit; or
the first loading current flows from the first input circuit to the loading stage circuit through the first branch circuit, and the second loading current flows from the first input circuit to the loading stage circuit through the second branch circuit, wherein the loading stage circuit generates the first stage output based on the first loading current and the second loading current.

* * * * *